US012727426B2

(12) United States Patent
Nakagawa et al.

(10) Patent No.: US 12,727,426 B2
(45) Date of Patent: Sep. 1, 2026

(54) MICROSTRUCTURE-TRANSFER STAMP COMPONENT

(71) Applicant: SHIN-ETSU CHEMICAL CO., LTD., Tokyo (JP)

(72) Inventors: Hideo Nakagawa, Omihachiman (JP); Yoshinori Ogawa, Kamakura (JP); Toshiyuki Ozai, Takasaki (JP)

(73) Assignee: SHIN-ETSU CHEMICAL CO., LTD., Tokyo (JP)

(*) Notice: Subject to any disclaimer, the term of this patent is extended or adjusted under 35 U.S.C. 154(b) by 251 days.

(21) Appl. No.: 18/267,201

(22) PCT Filed: Nov. 16, 2021

(86) PCT No.: PCT/JP2021/041985

§ 371 (c)(1),
(2) Date: Jun. 14, 2023

(87) PCT Pub. No.: WO2022/137889

PCT Pub. Date: Jun. 30, 2022

(65) Prior Publication Data

US 2024/0047243 A1 Feb. 8, 2024

(30) Foreign Application Priority Data

Dec. 24, 2020 (JP) ................................ 2020-214942

(51) Int. Cl.
*H10P 72/00* (2026.01)

(52) U.S. Cl.
CPC ................................ *H10P 72/0446* (2026.01)

(58) Field of Classification Search
CPC ......... H01L 21/67144; H01L 21/67011; H01L 21/67; H01L 21/00
See application file for complete search history.

(56) References Cited

U.S. PATENT DOCUMENTS 7,943,491 B2 * 5/2011 Nuzzo ................ H10F 77/1696 438/735
2010/0123268 A1 * 5/2010 Menard .................. H01L 24/97 264/293

(Continued)

FOREIGN PATENT DOCUMENTS

JP H10-133585 A 5/1998
JP 2005-260140 A 9/2005

(Continued)

OTHER PUBLICATIONS

Nov. 11, 2024 Office Action and Search Report issued in Taiwanese Patent Application No. 110144357.

(Continued)

*Primary Examiner* — Lawrence Averick
(74) *Attorney, Agent, or Firm* — Oliff PLC

(57) ABSTRACT

A microstructure-transfer stamp component including a substrate and a silicone-based rubber film formed on the substrate, wherein a surface of the silicone-based rubber film facing away from the substrate has one or more recesses each being closed except for a surface opening. This provides a microstructure-transfer stamp component that can optimize temporary adhesive strength of the surface of the silicone-based rubber film stamp in a short period of time.

21 Claims, 20 Drawing Sheets

(56) References Cited

U.S. PATENT DOCUMENTS

| | | | | |
|---|---|---|---|---|
| 2017/0047306 | A1 | 2/2017 | Meitl et al. | |
| 2022/0124949 | A1 * | 4/2022 | Nakagawa ......... | H05K 13/0409 |
| 2025/0287559 | A1 | 9/2025 | Nakagawa et al. | |

FOREIGN PATENT DOCUMENTS

| | | | |
|---|---|---|---|
| JP | 2008-153310 | A | 7/2008 |
| JP | 2019-102509 | A | 6/2019 |
| JP | 2020-129638 | A | 8/2020 |
| TW | 202032691 | A | 9/2020 |
| WO | 2020/166184 | A1 | 8/2020 |

OTHER PUBLICATIONS

Dec. 20, 2024 extended Search Report issued in European Patent Application No. 21910042.7.

Feb. 3, 2026 Office Action issued in Japanese Application 2025-082240.

Jan. 23, 2024 Office Action issued in Japanese Patent Application No. 2020-214942.

Sep. 2, 2025 Office Action issued in Korean Application No. 10-2023-7019892.

Meitl et al., “Transfer Printing by Kinetic Control of Adhesion to an Elastomeric Stamp,” Nature Materials, Letters, vol. 5, Jan. 2006, pp. 33-38.

Feb. 1, 2022 International Search Report issued in International Patent Application No. PCT/JP2021/041985.

Jun. 13, 2023 International Preliminary Report on Patentability issued in International Patent Application No. PCT/JP2021/041985.

Apr. 23, 2026 Office Action issued in Korean Application No. 10-2023-7019892.

* cited by examiner

[FIG. 1]
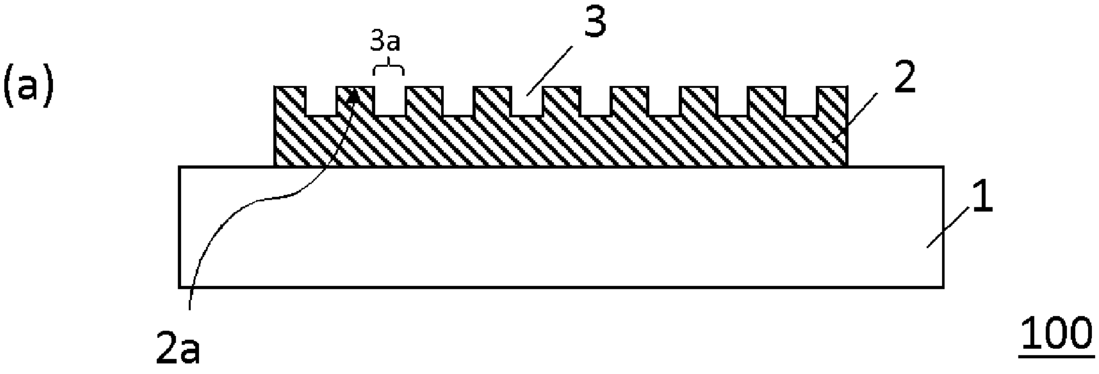
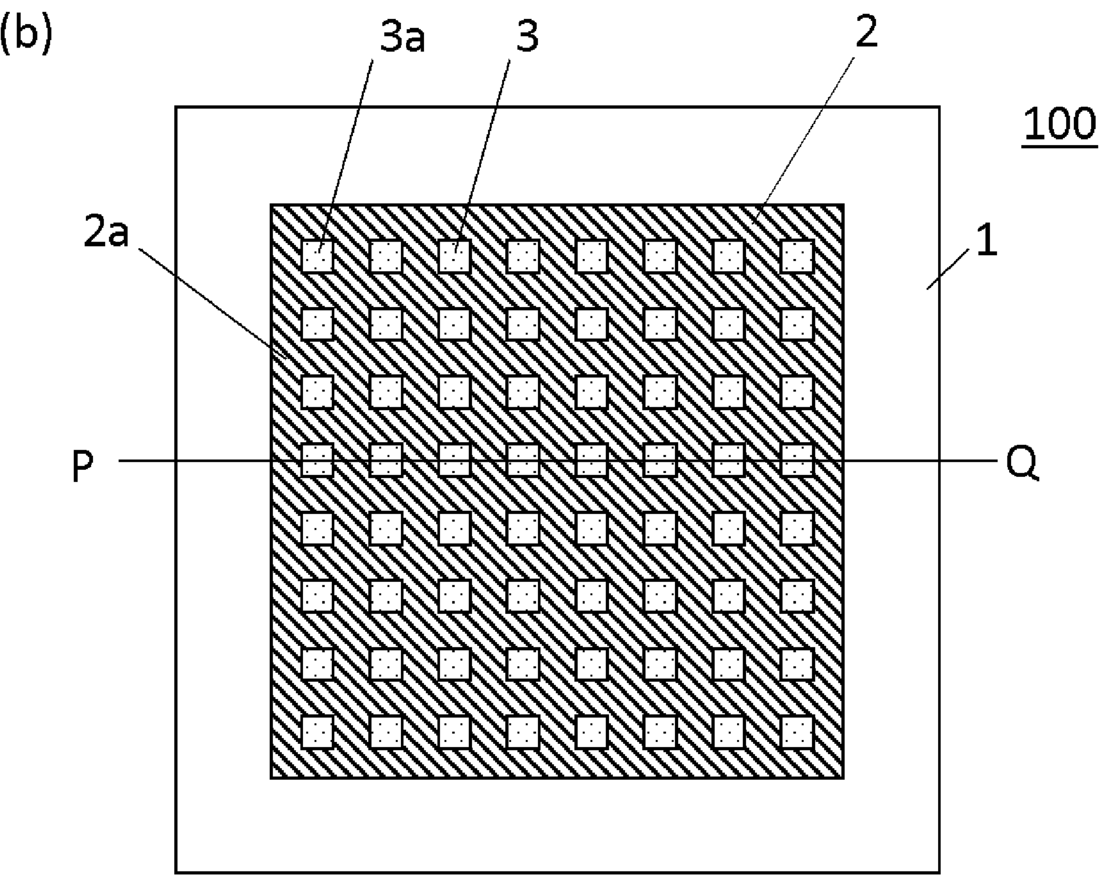

[FIG. 2]
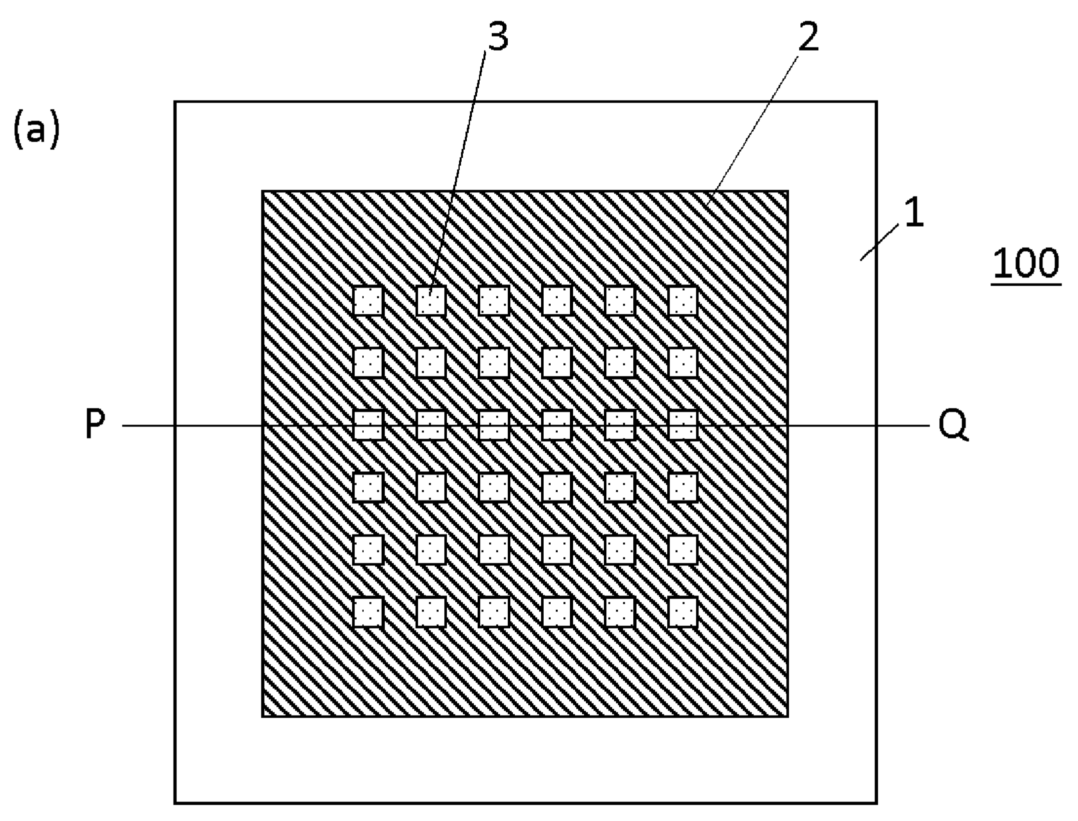
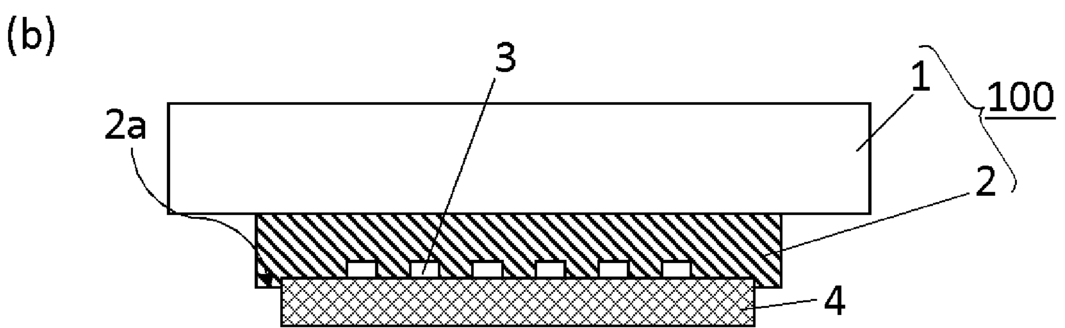
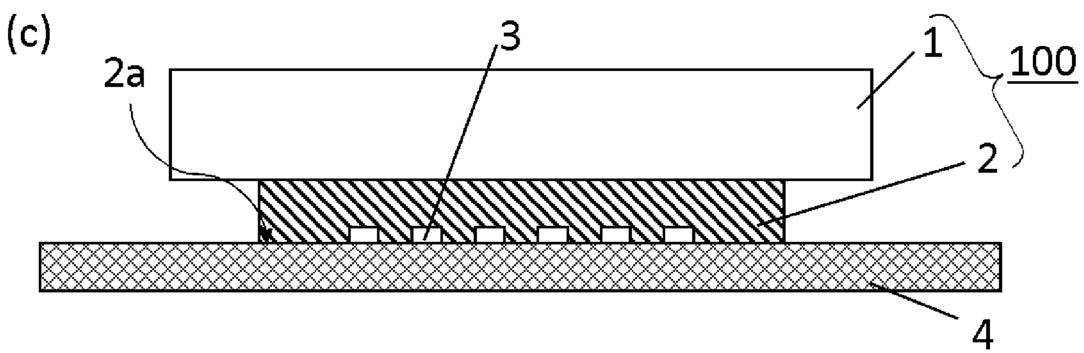

[FIG. 3]
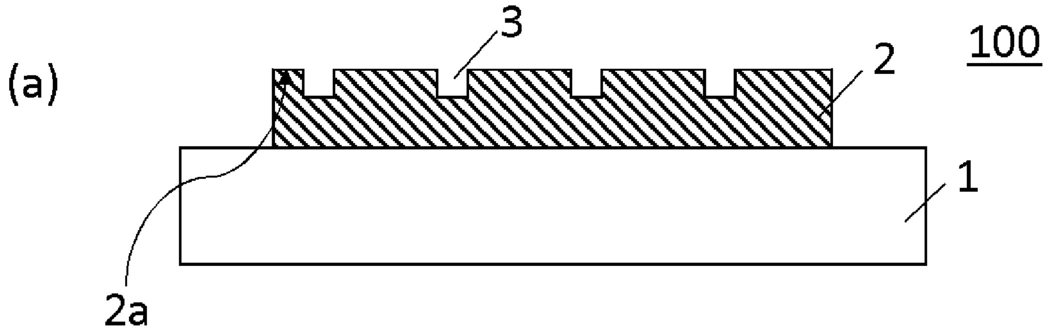
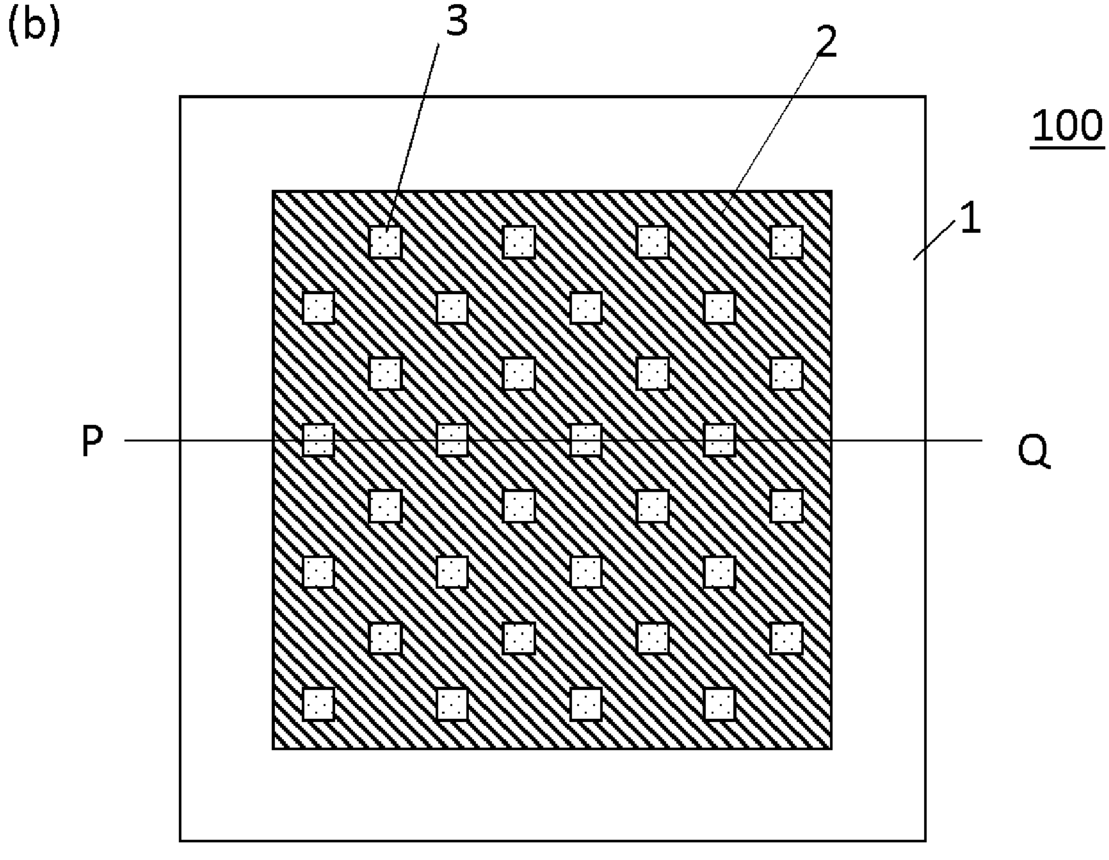

[FIG. 4]
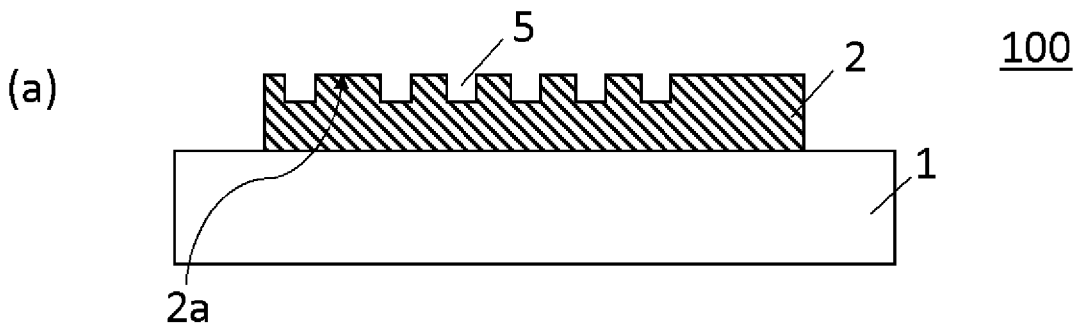
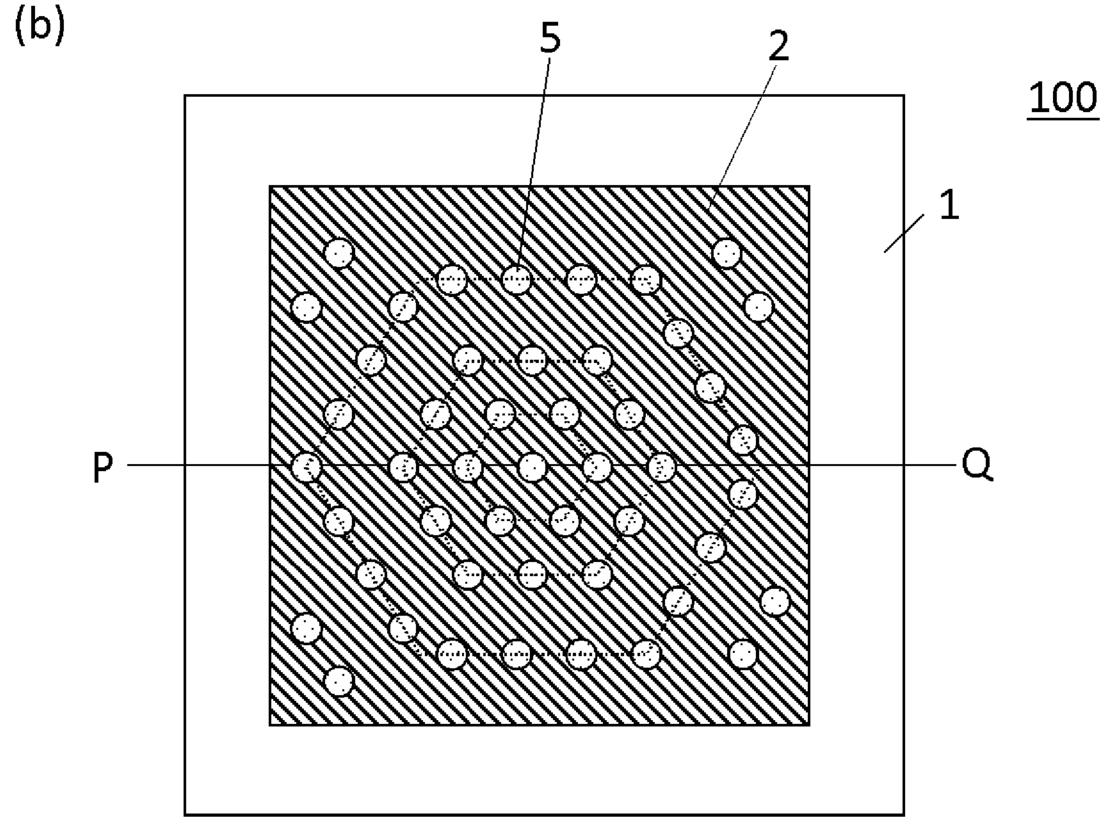

[FIG. 5]
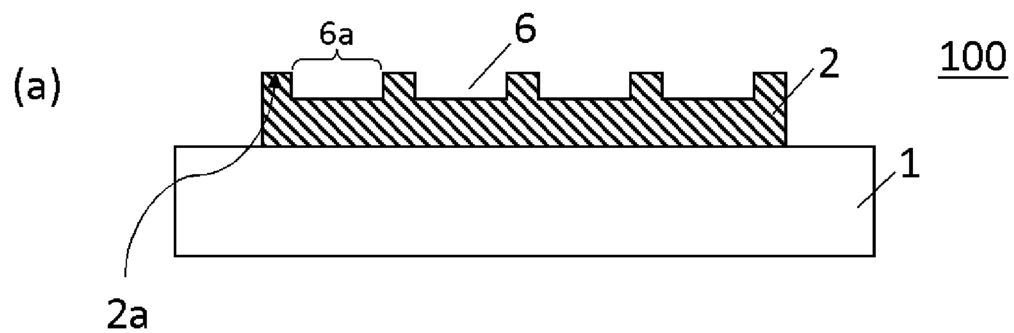
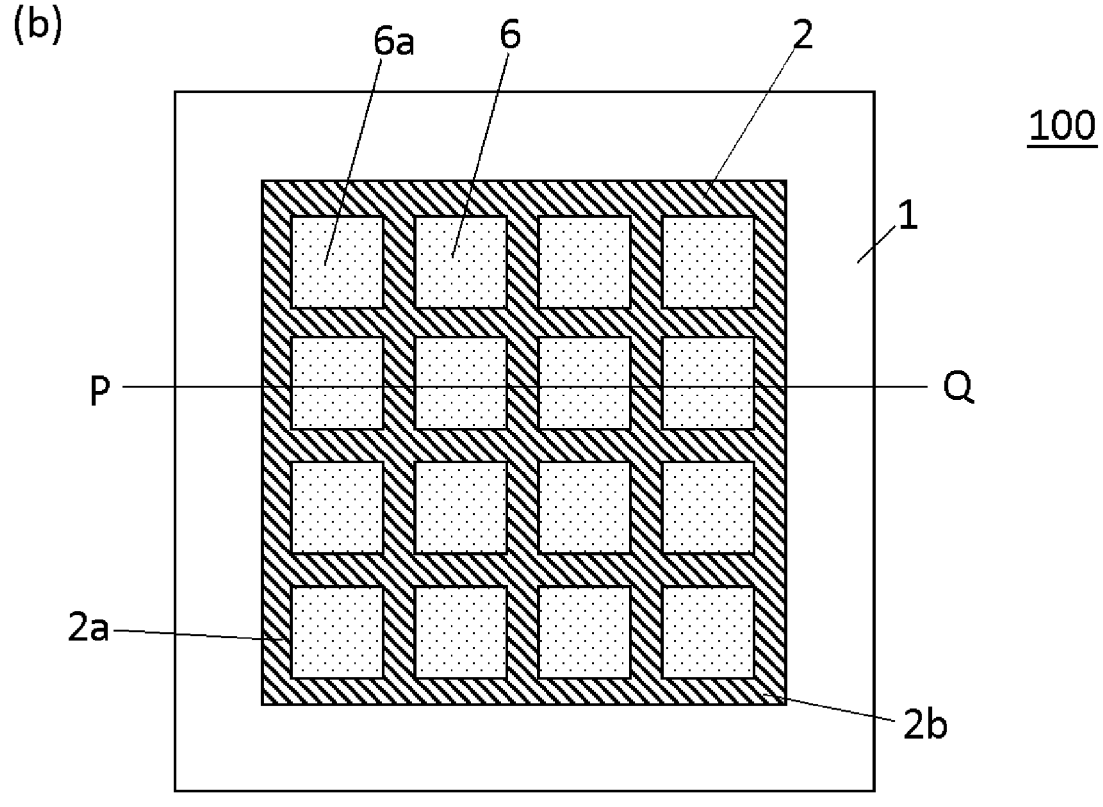

[FIG. 6]
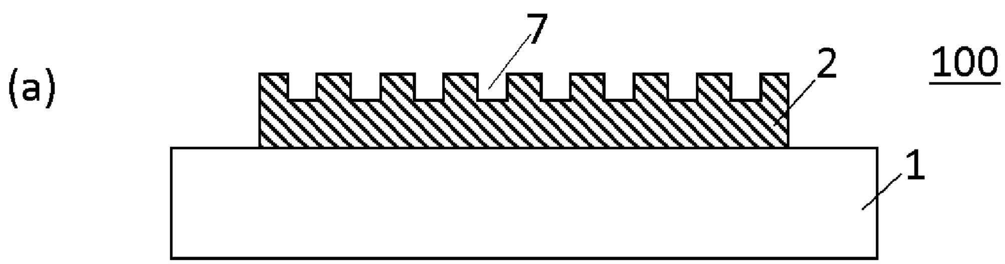
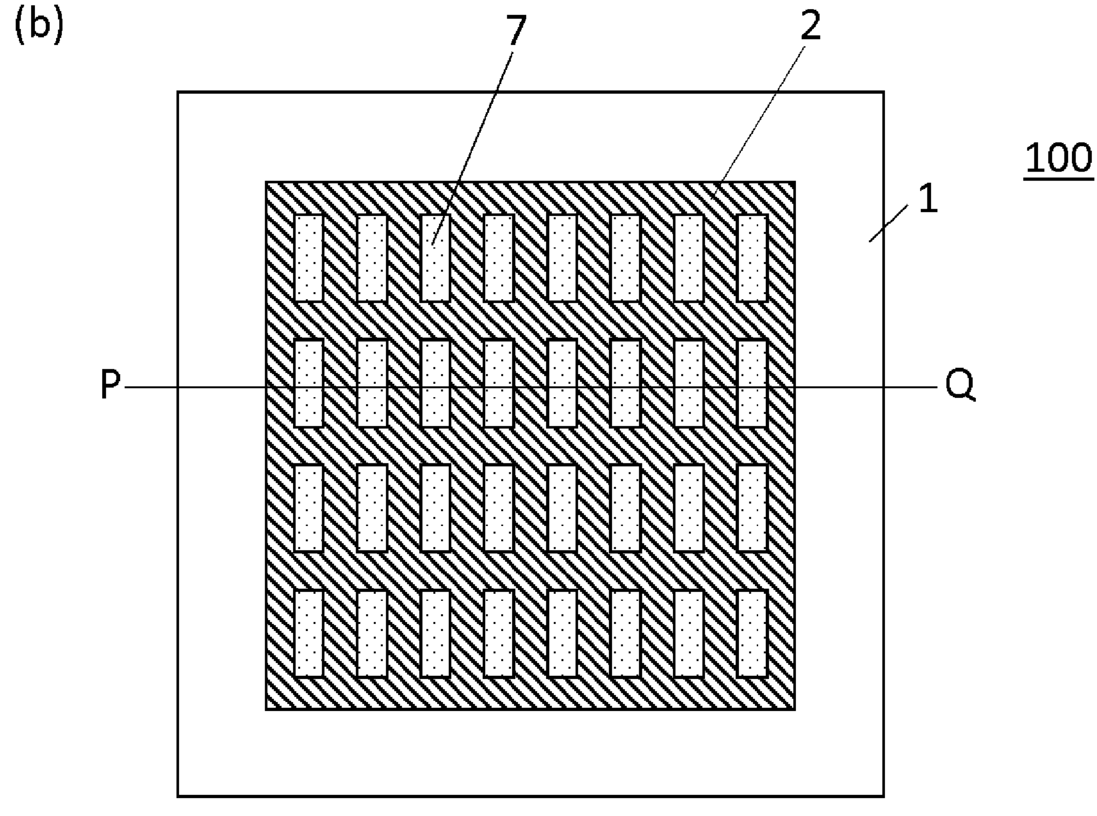

[FIG. 7]
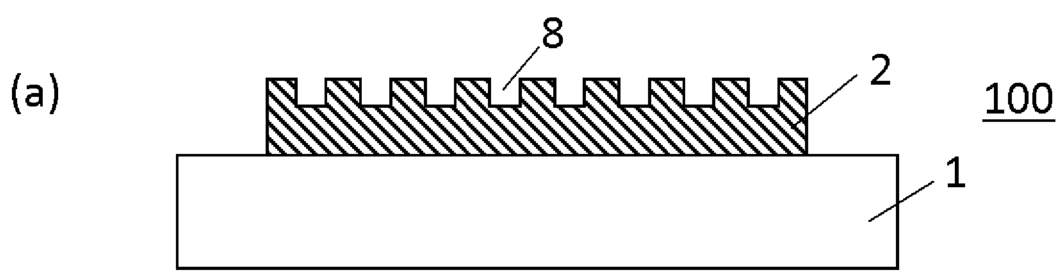
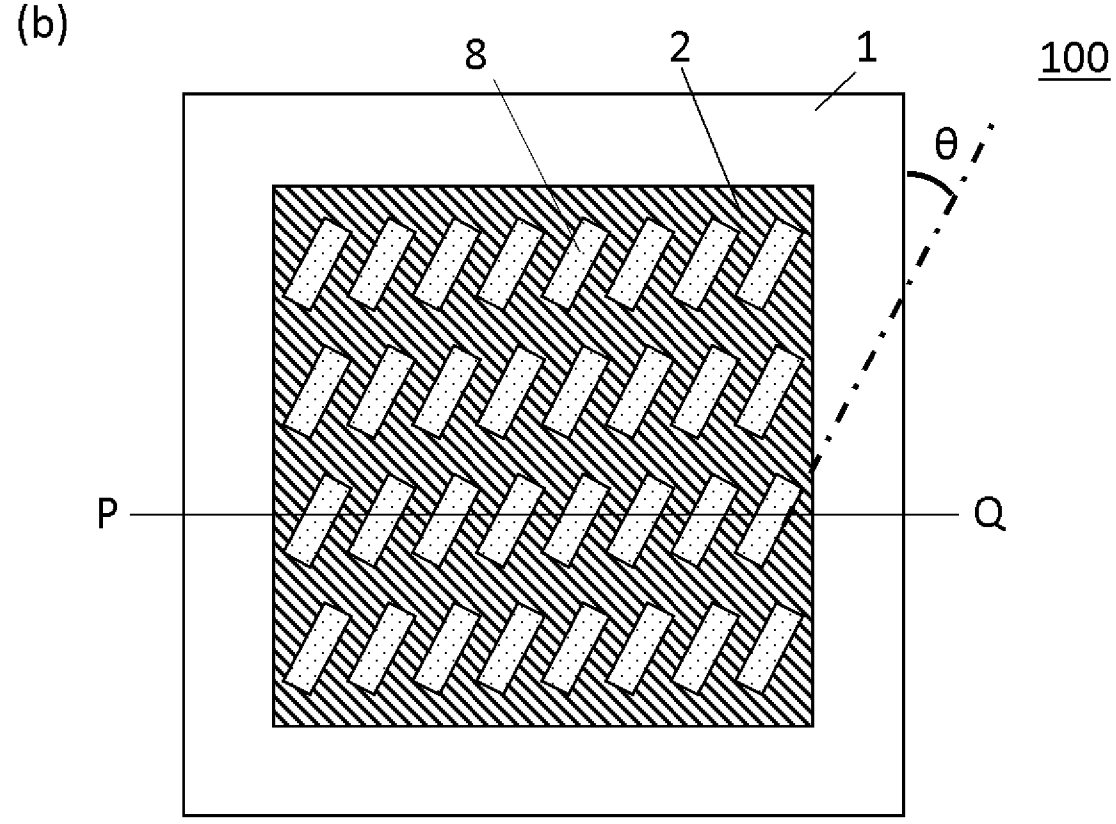

[FIG. 8]
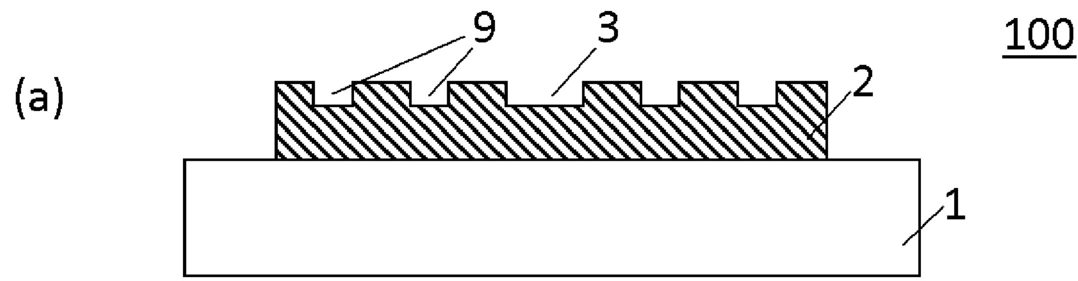
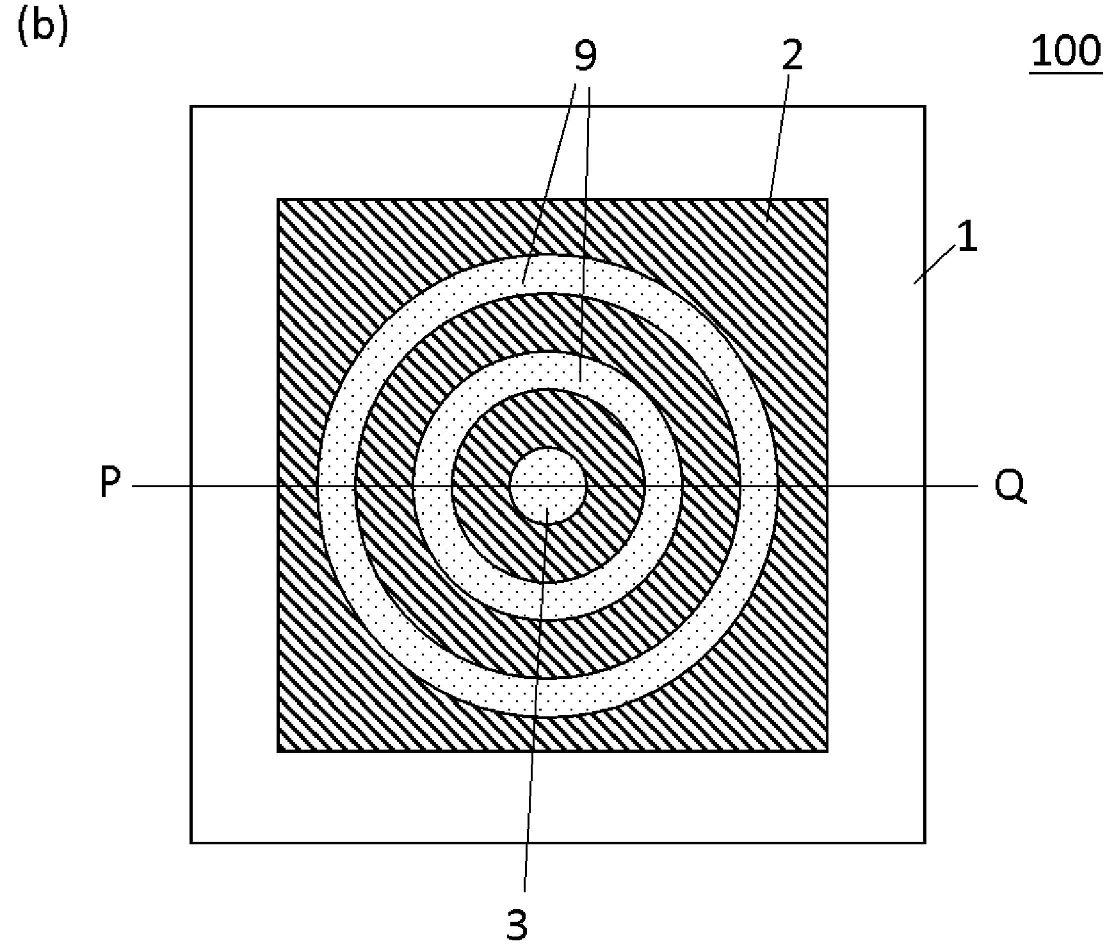

[FIG. 9]
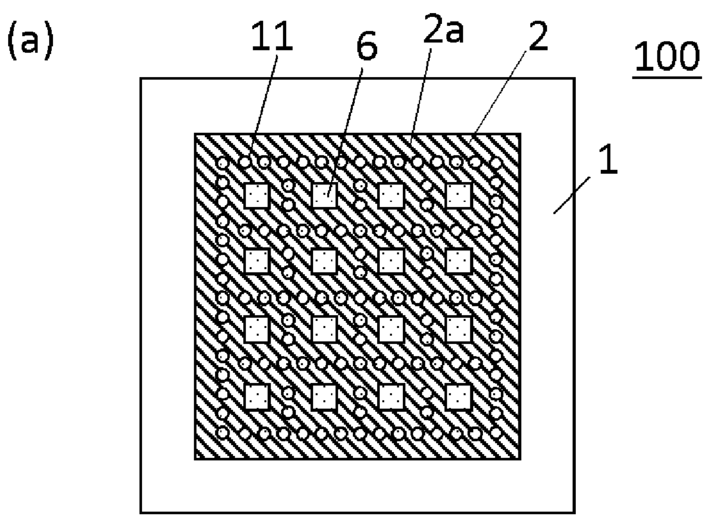
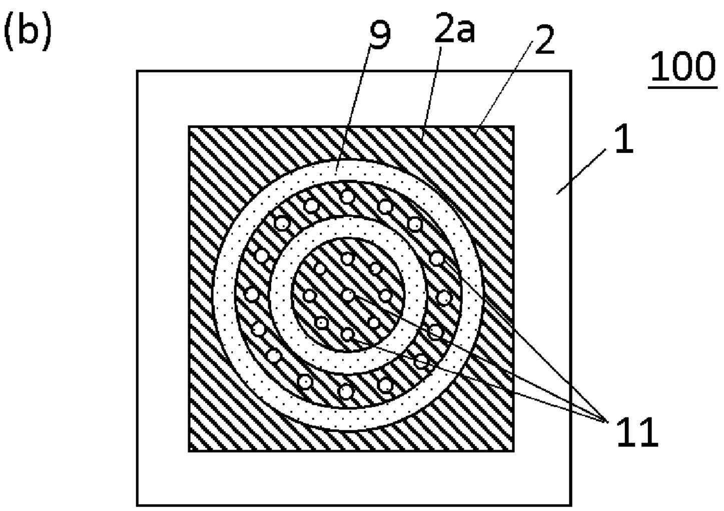
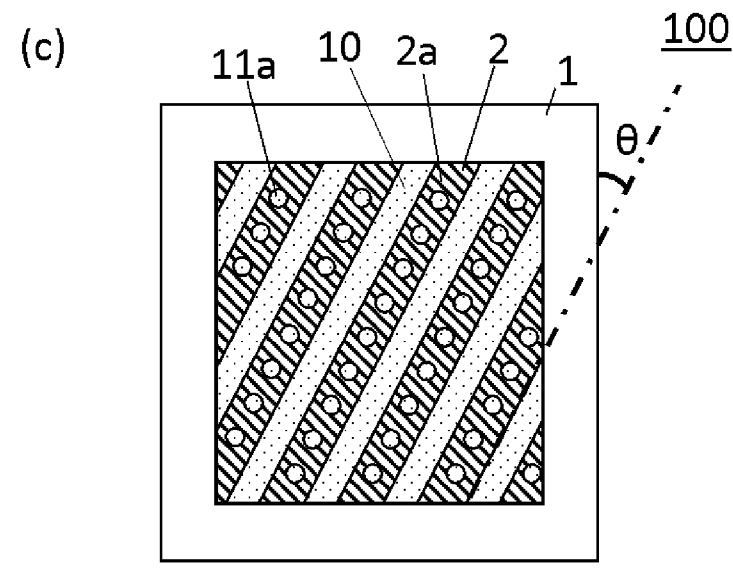

[FIG. 10]
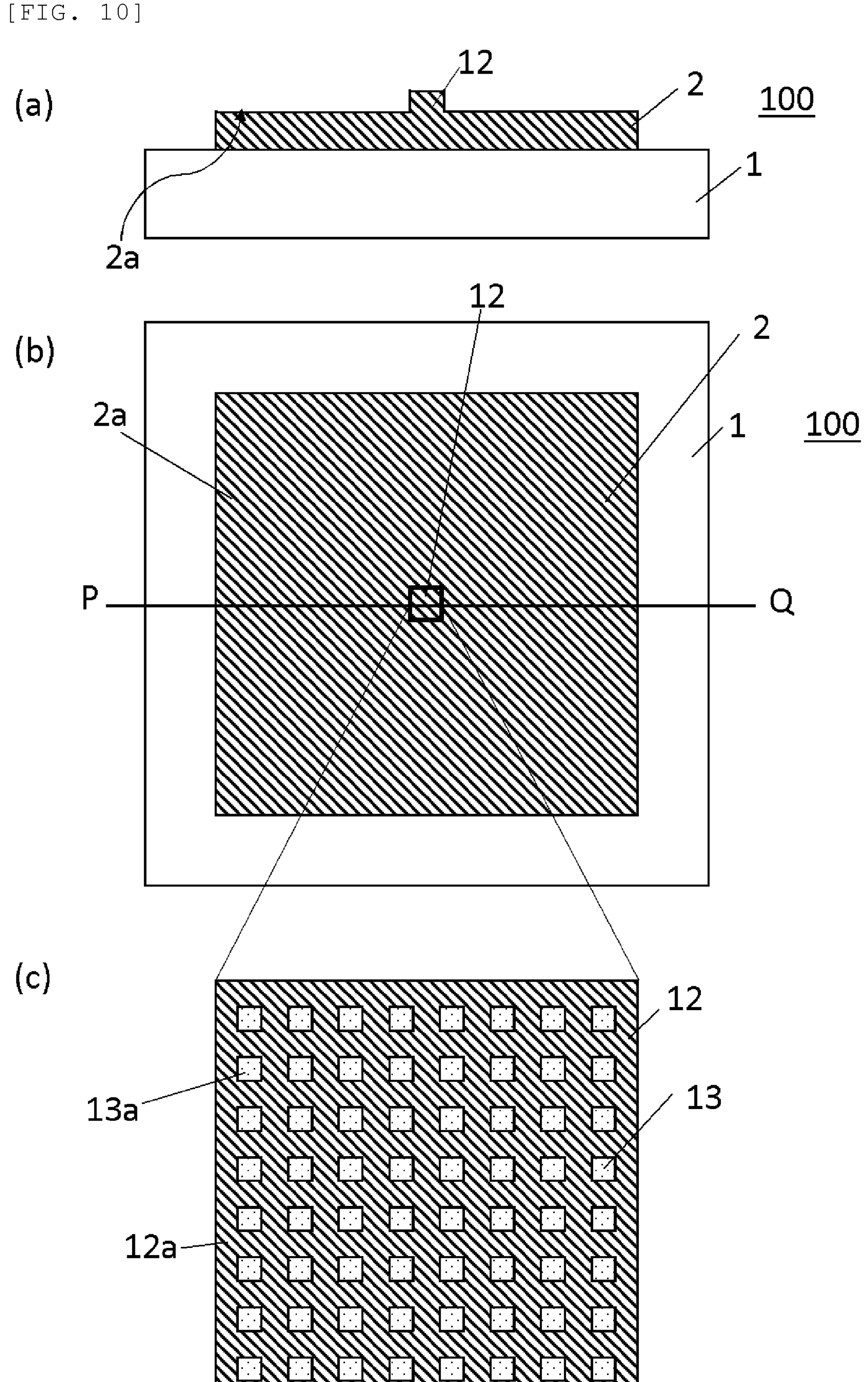

[FIG. 11]
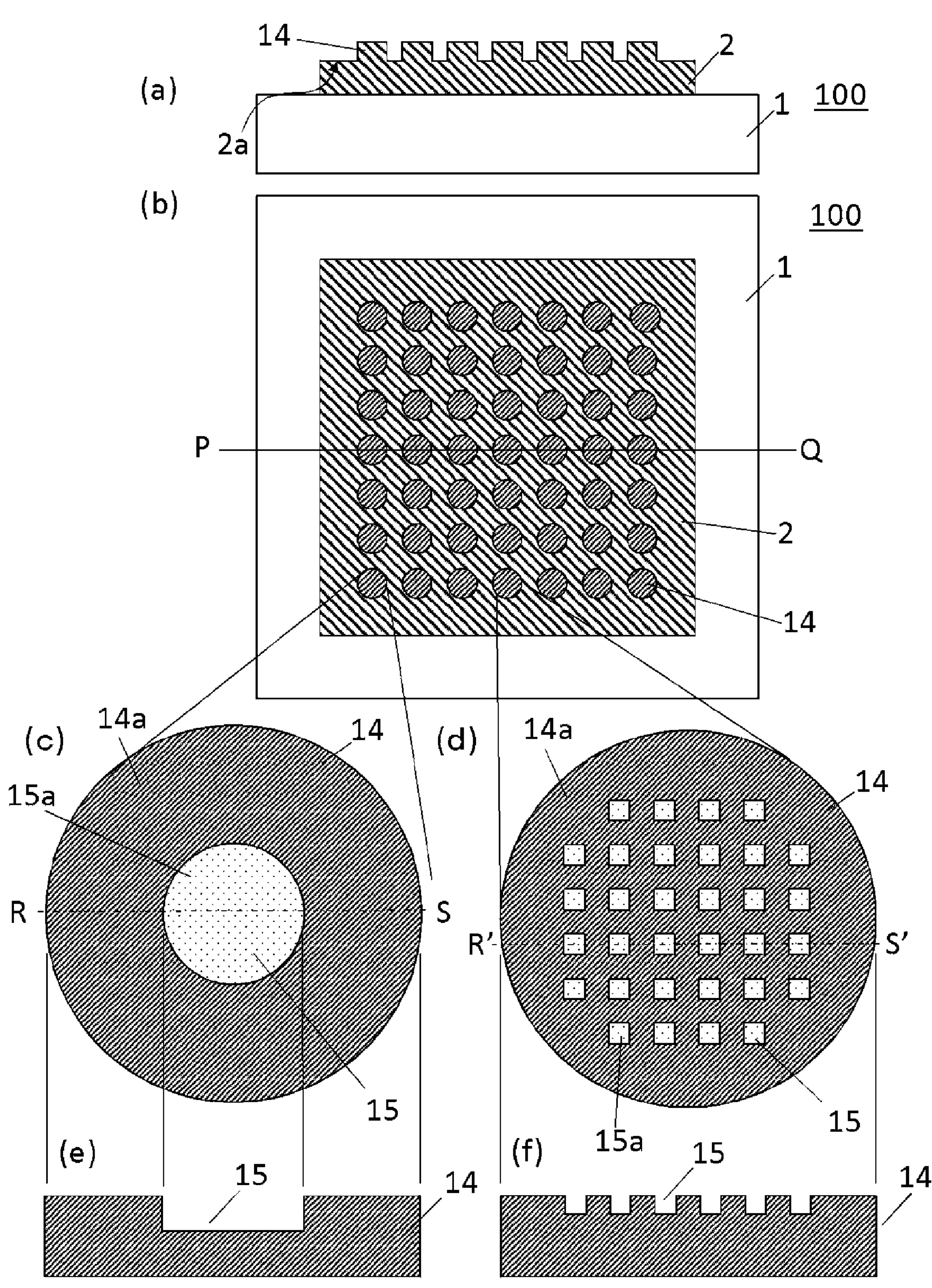

[FIG. 12]
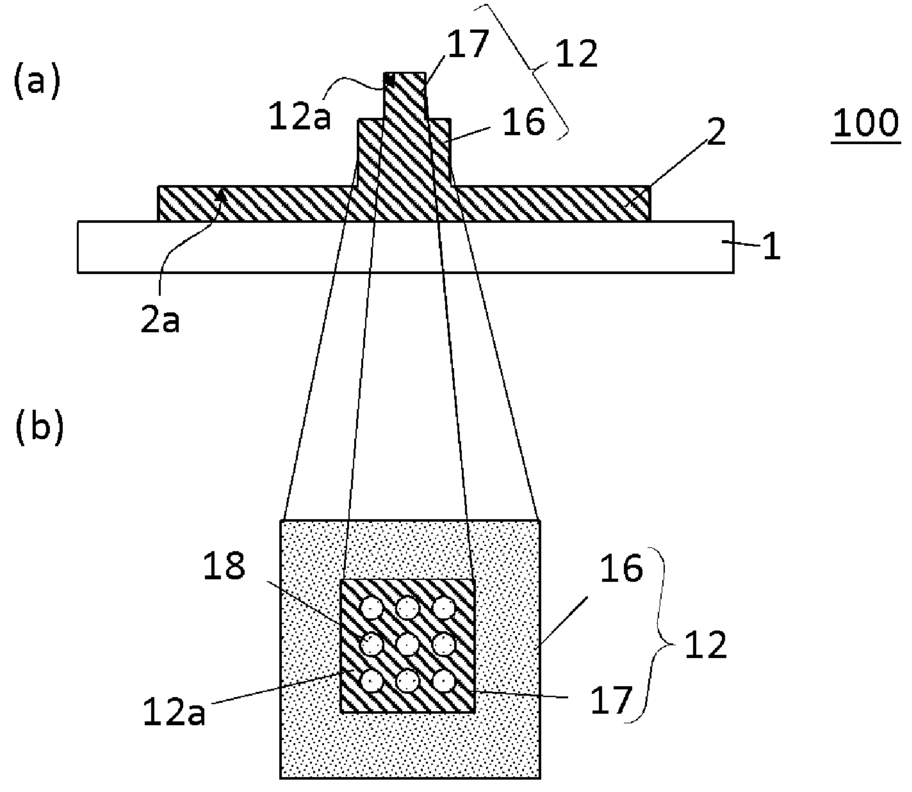
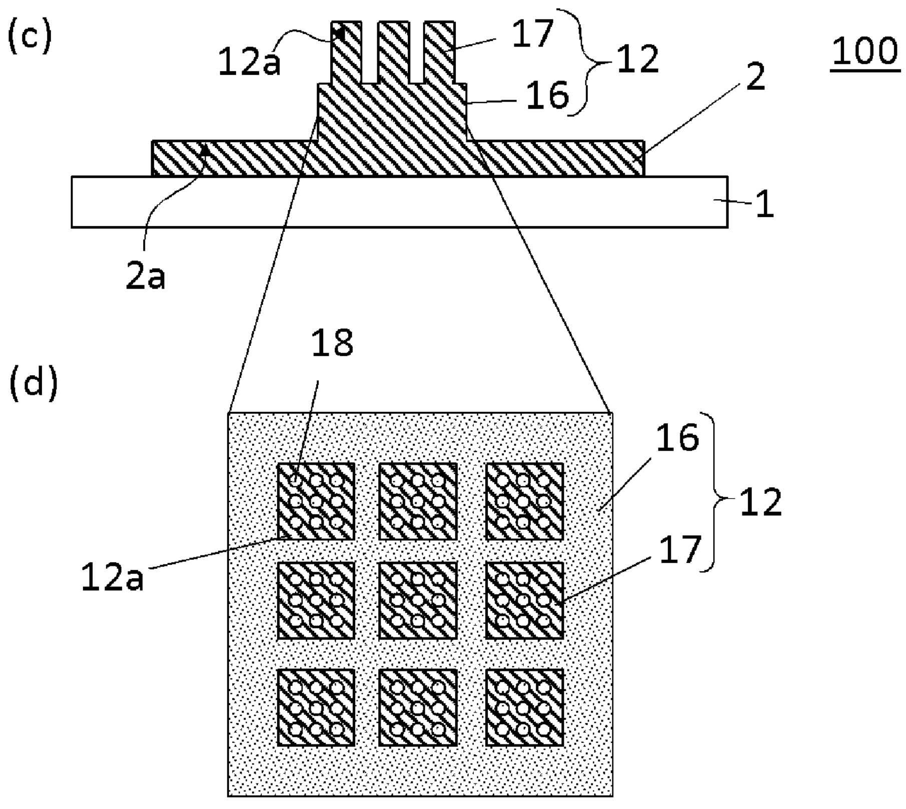

[FIG. 13]
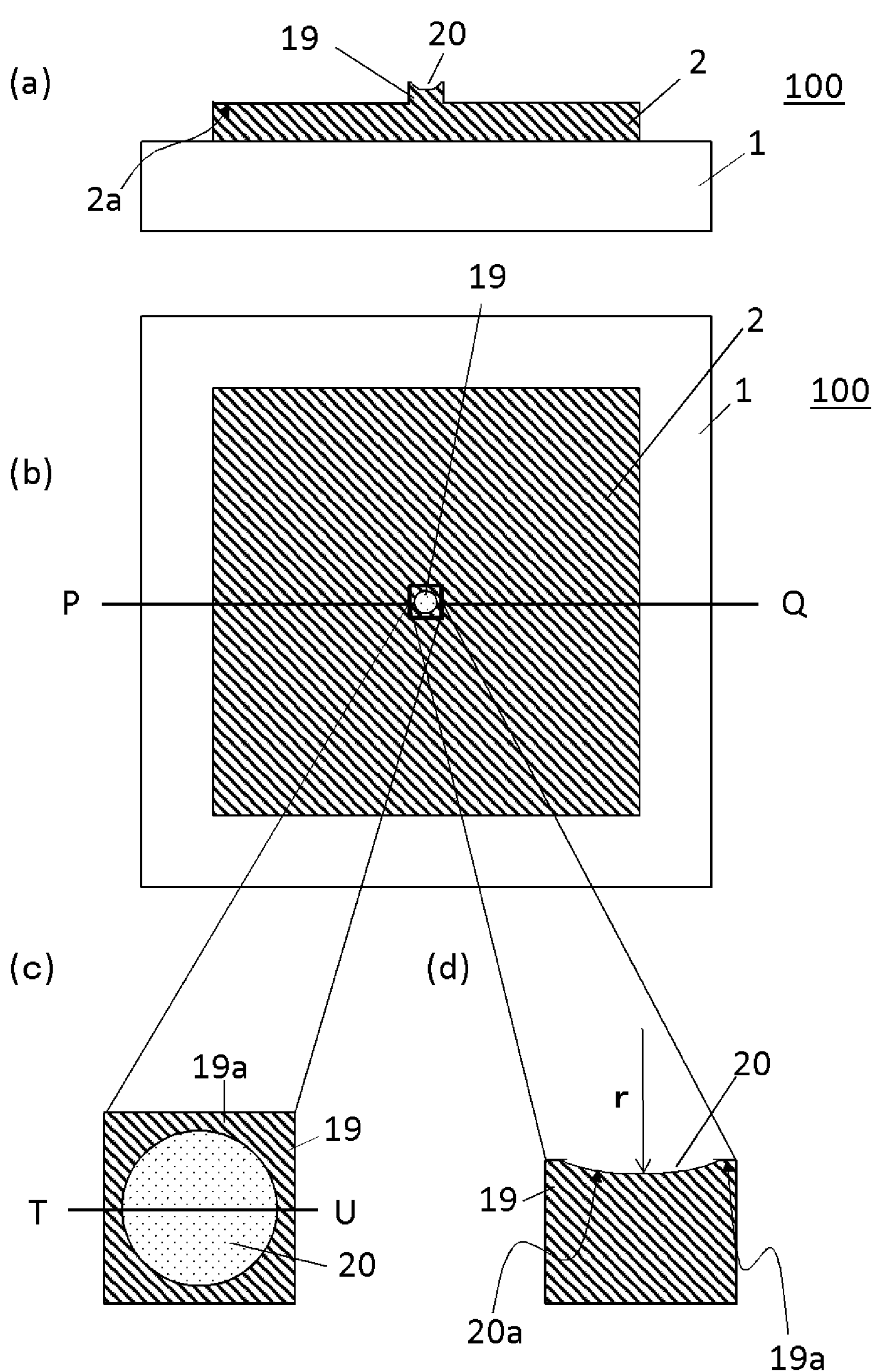

[FIG. 14]
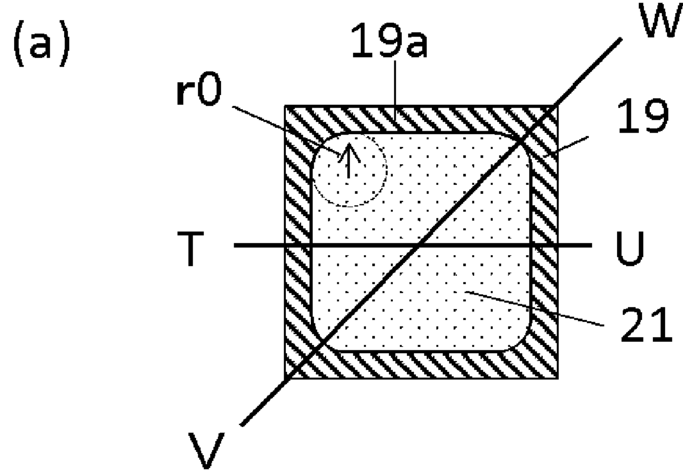
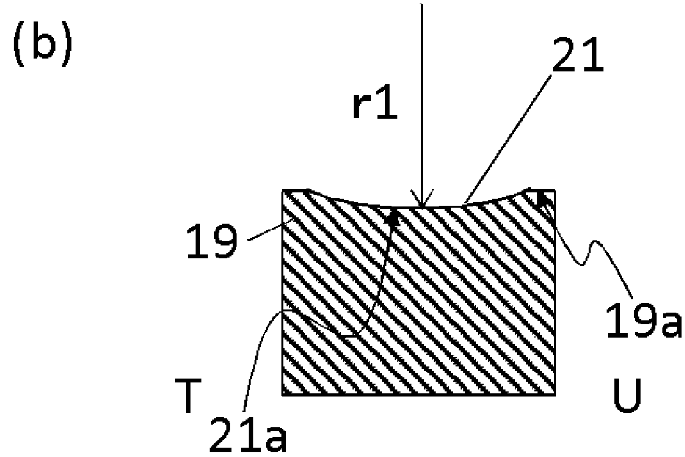
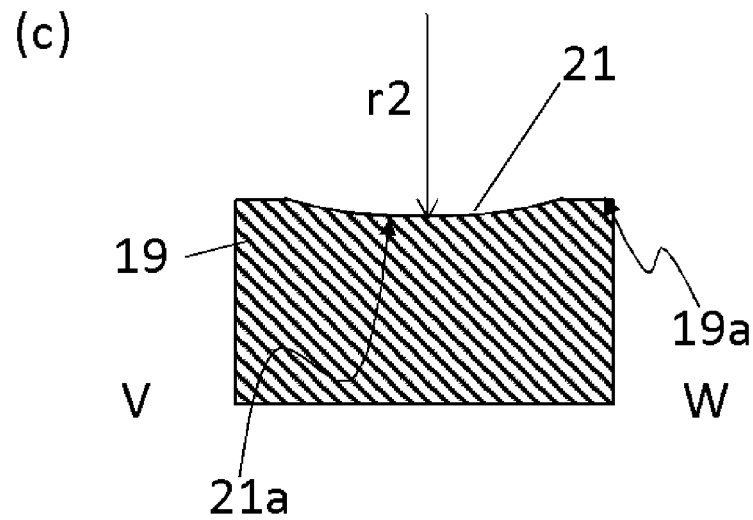

[FIG. 15]
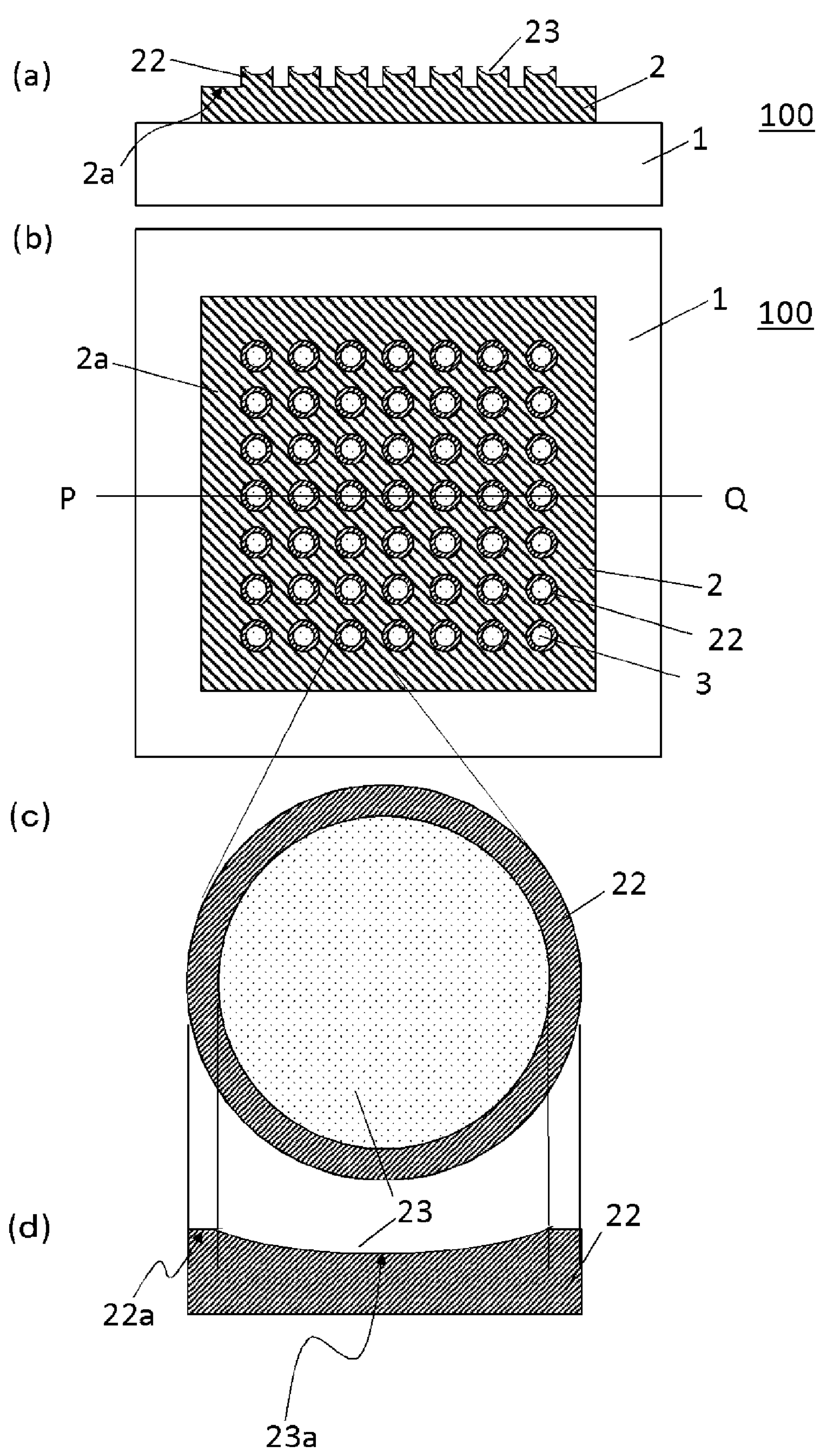

[FIG. 16]
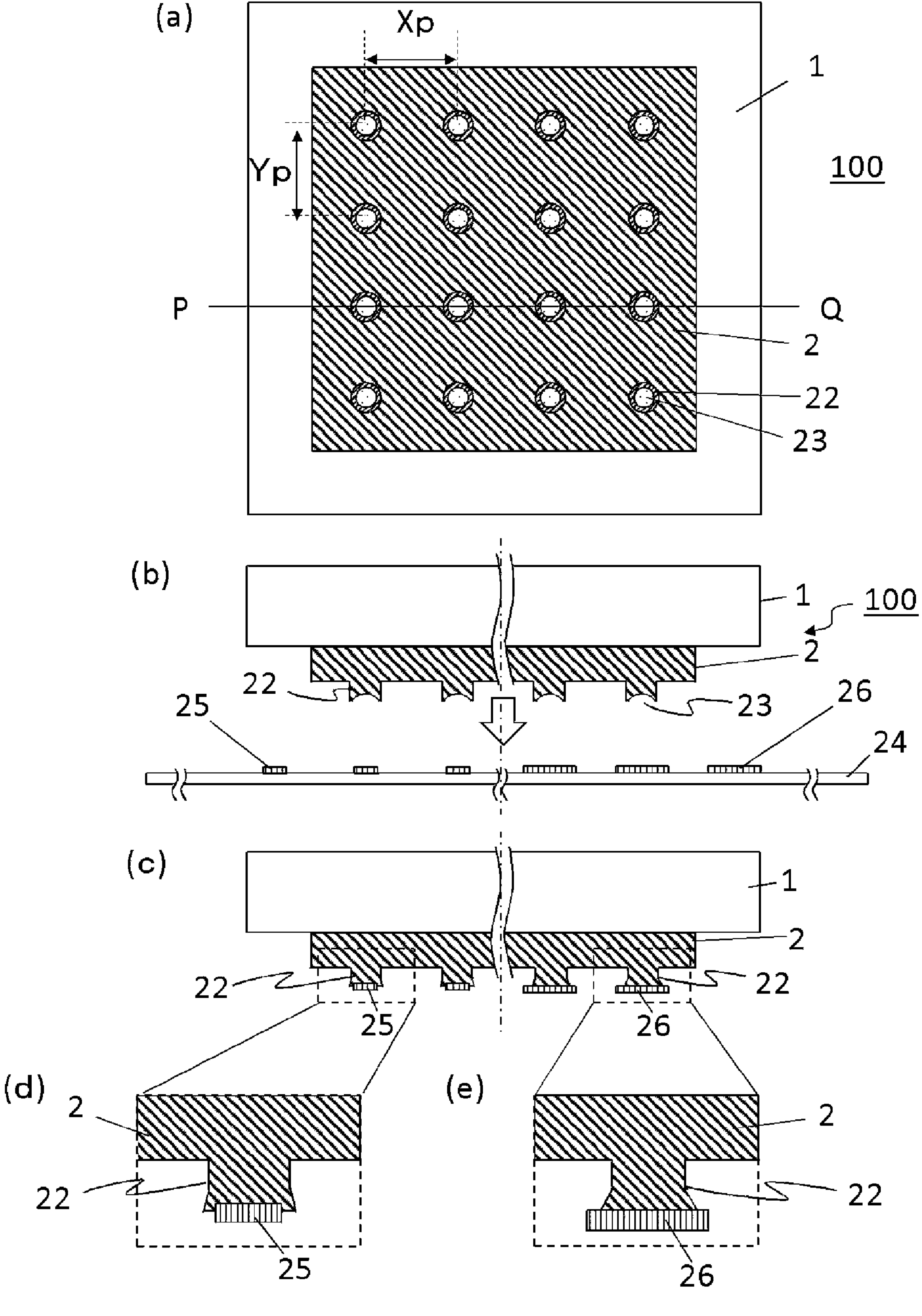

[FIG. 17]
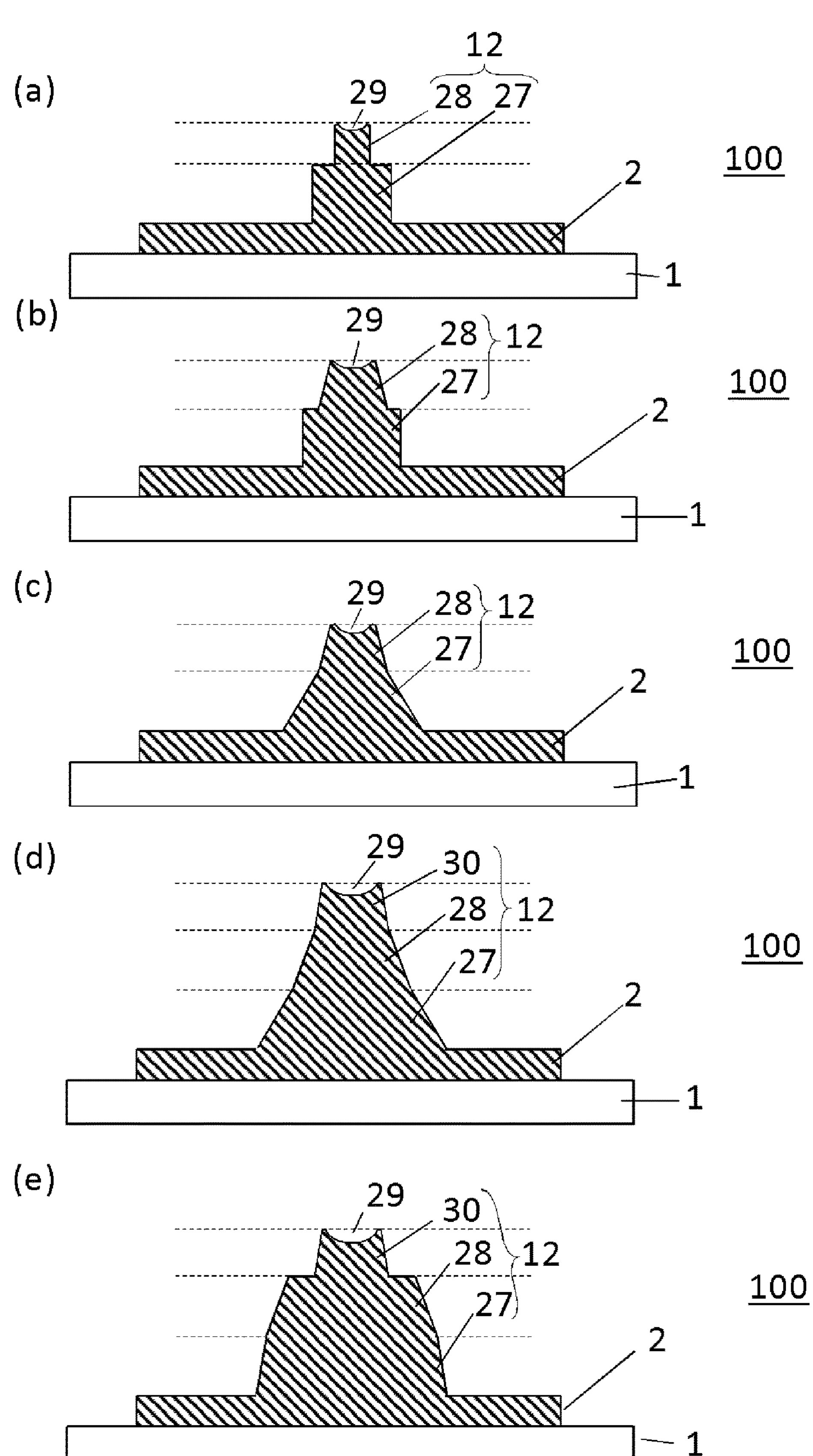

[FIG. 18]
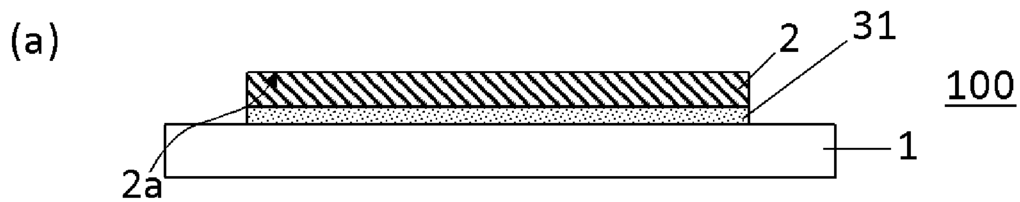
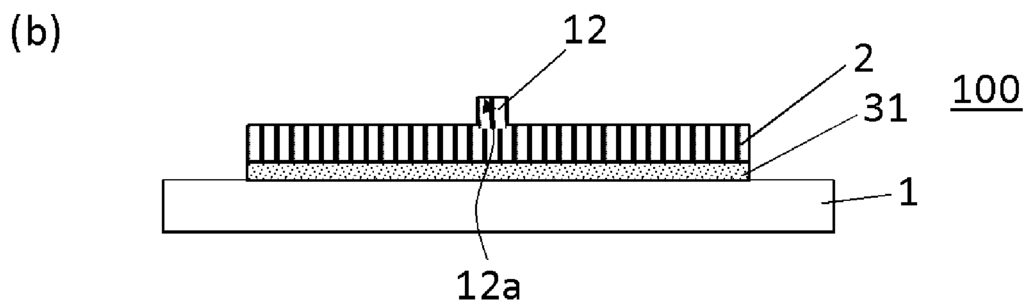
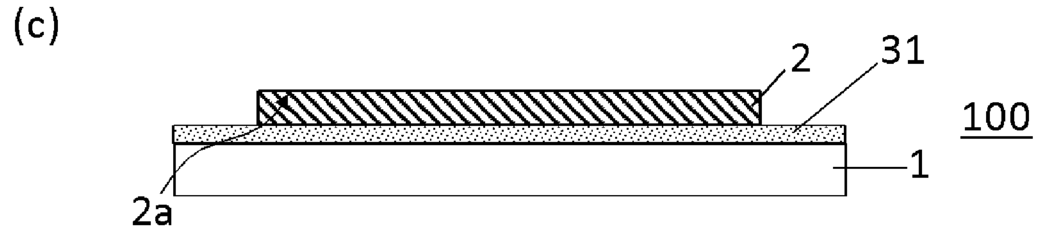
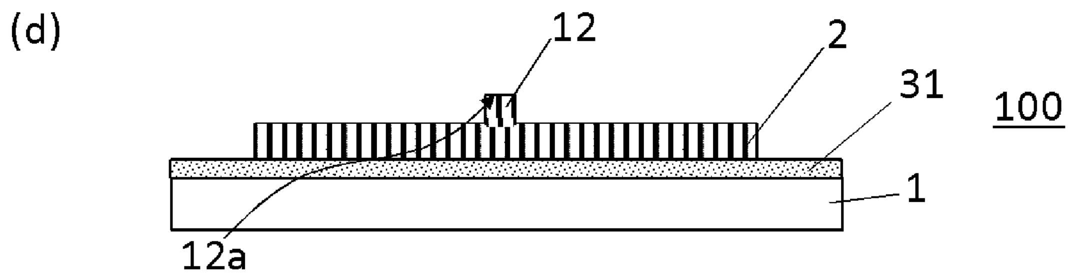
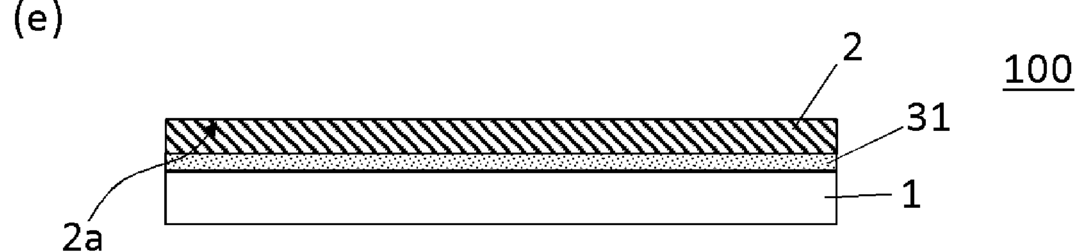
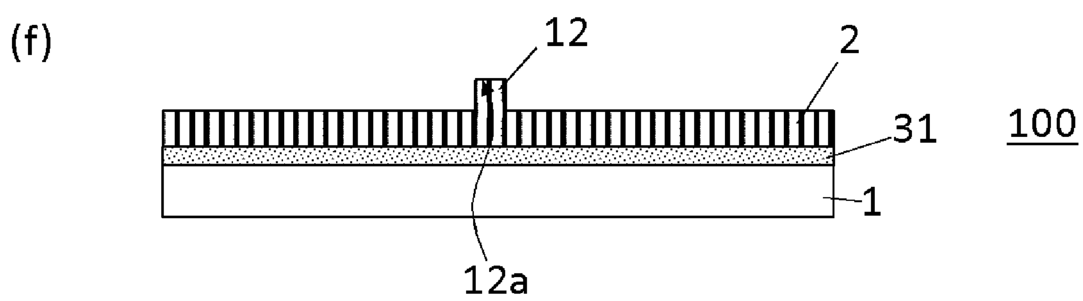

[FIG. 19]
(a)
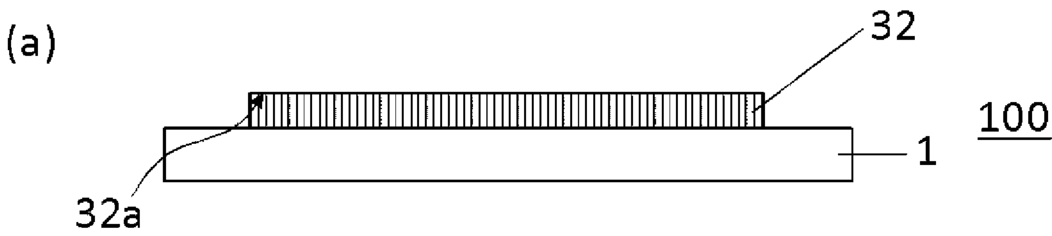
(b)
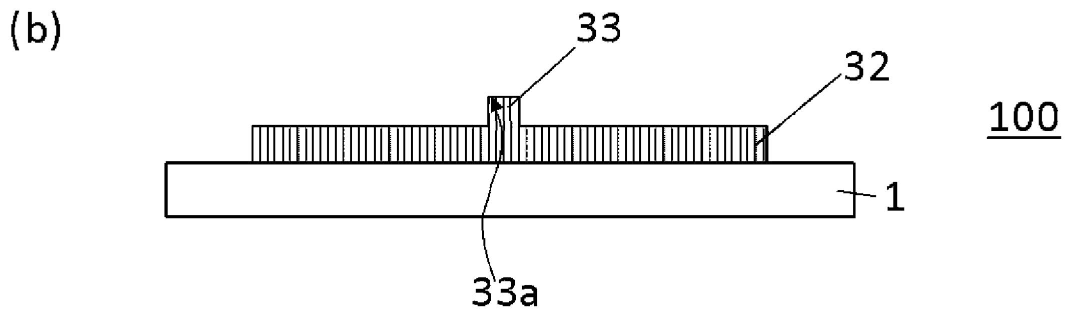
(c)
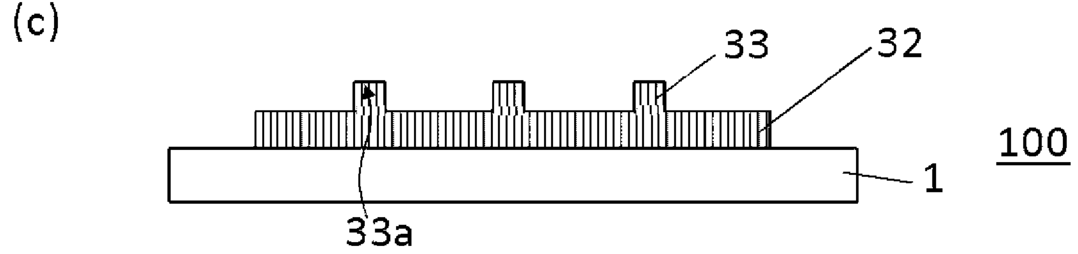
(d)
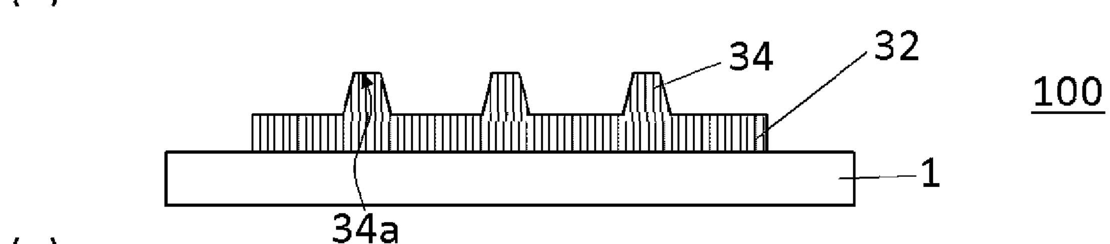
(e)
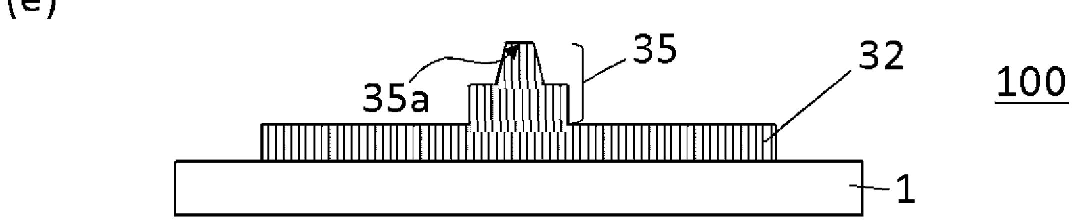
(f)
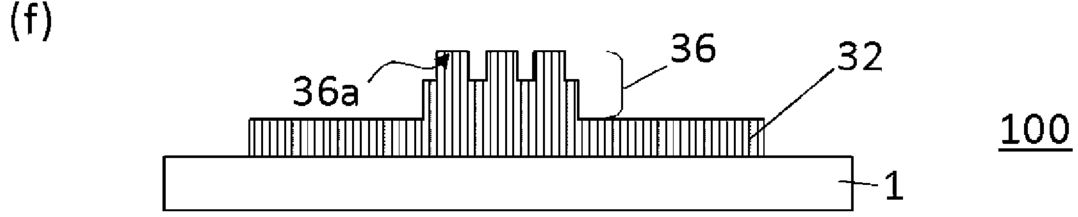

[FIG. 20]
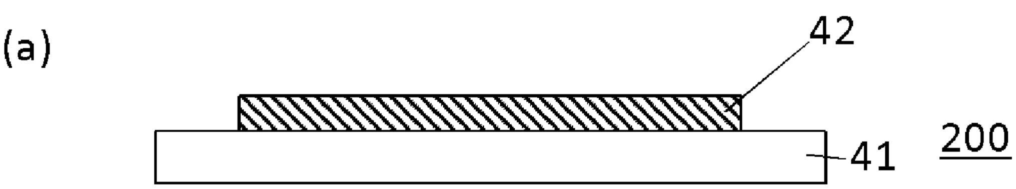
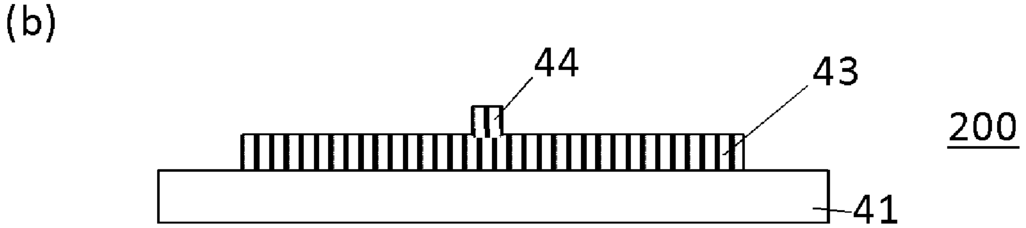
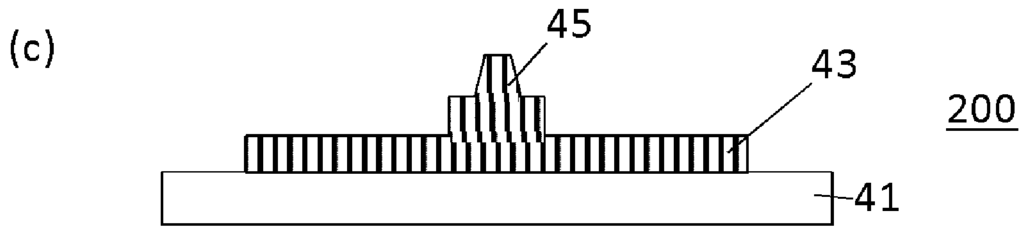
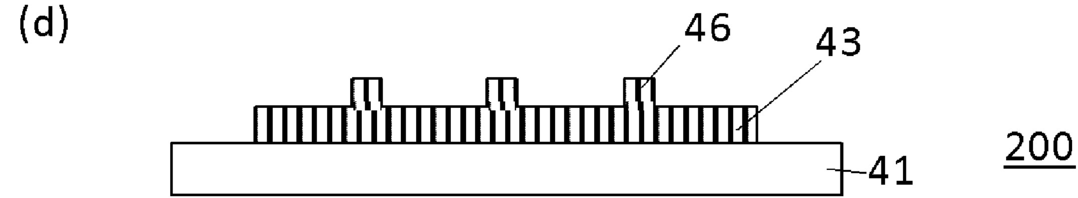
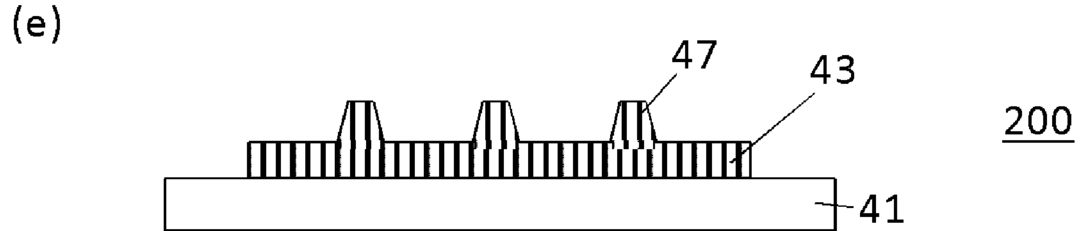
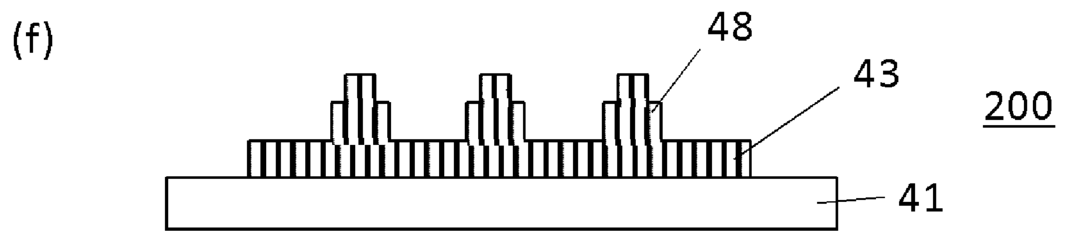

MICROSTRUCTURE-TRANSFER STAMP COMPONENT

TECHNICAL FIELD

The present invention relates to a stamp component for transferring microstructures by using a stamping method.

BACKGROUND ART

With miniaturization of semiconductor devices, recent focus has been given to microstructure transferring techniques using stamps as a means of assembling electrical and electronic applied products that employ semiconductor devices (Non Patent Document 1). In particular, active technical development is taking place to manufacture displays for signage, TVs, medical use, on-board use, tablet computers, smartphones, smartwatches, etc. as well as LED displays for AR/VR, etc. by employing the above techniques to transfer a single, multiple, or even as much as tens of thousands of mini LEDs (LEDs with a short side having a length from 100 μm to several 100 μm) or micro LEDs (with a short side having a length of 100 μm or less, or even 50 μm or less) at once.

With miniaturization and thinning of semiconductor chips and various electric and electronic devices, transferring of microstructure by virtue of a stamp is about to be used in mounting semiconductors and assembling electronic equipment, in place of conventional transferring of a device by virtue of vacuum suction. For example, objects to be transferred include a wide variety of microdevices such as various advanced LSI/IC chips, micro resistors, capacitors, inductors, SAW filter devices, MEMS chips such as acceleration sensors, etc.

As such, microstructure transfer by virtue of a stamp is growing to be an essential technique to manufacture equipment that will enrich and diversify our lives in the future.

It has been reported that a rubber stamp based on silicone, e.g., PDMS (polydimethylsiloxane), can be used for an adhesive layer used in the stamping method to receive a large quantity of devices from a donor substrate and transport them to a receiving substrate (Patent Document 1). Patent Document 2 discloses, as a more practical embodiment, a stamp structure which is advanced to adapt to a chip mounting apparatus.

FIG. 20 illustrates an example structure of a microstructure-transfer stamp component of conventional art.

Referring to FIG. 20, example structure and features of the conventional stamp shown in Patent Document 2 will be briefly described. In FIG. 20, reference numeral 41 refers to a quartz substrate, and reference numeral 42 refers to a silicone-based rubber film. Reference numeral 43 refers to a silicone-based rubber film, and reference numerals 44 to 48 refer to protrusions, made of a silicone-based rubber film, formed on a surface of the silicone-based rubber film 43.

FIG. 20(a) illustrates a flat stamp 200 with the silicone-based rubber film 42 formed on the quartz substrate 41, which is used to transfer multiple or a large quantity of microstructures at once. FIGS. 20(b) to (*f*) each illustrate the silicone-based rubber film 43 formed on the quartz substrate 41. Surfaces of the respective silicone-based rubber films 43 facing away from the quartz substrate 41 are provided with protrusions 44 to 48. The stamp 200 provided with these protrusions is used to transfer a single or multiple objects to be transferred.

The object to be transferred is to be temporarily adhered to the surface of the silicone-based rubber film 42 or an uppermost surface of each of the protruding portions of the protrusions 44 to 48 by virtue of pressure-sensitive adhesive strength of the silicone-based rubber and moved to a predetermined position, where the object to be transferred is brought into contact with a destination site. Then, the surface of the silicone-based rubber film is peeled away from the object to be transferred, leaving the transfer object at the predetermined position. For example, by disposing, on a surface of the predetermined destination site, resin or the like with larger adhesive strength than the temporary adhesive strength of the surface of the silicone-based rubber film, the object to be transferred can be received by the surface of the predetermined destination site, and the surface of the silicone-based rubber film 42 or the surface of each of the uppermost protruding portions of the protrusions 44 to 48 can be peeled away from the object to be transferred. In such cases, the temporary adhesive strength of the surface of the silicone-based rubber film, which determines the transfer ability, mainly originates from pressure-sensitive adhesive strength and depends on hardness, surface adhesion, tackiness, etc. of the silicone-based rubber film. Therefore, it has been necessary to adjust and optimize the physical properties of the silicone-based rubber film to meet the requirements defined by characteristics of the object to be transferred such as the size, surface morphology, and weight, or process conditions such as the transfer speed and acceleration of the transfer apparatus.

CITATION LIST

Patent Literature

Patent Document 1: U.S. Pat. No. 7,943,491 B

Patent Document 2: JP 2020-129638 A

Non-Patent Literature

Non Patent Document 1: Matthew A. Meitl, Zheng-Tao Zhu, Vipan Kumar, Keon Jae Lee, Xue Feng, Yonggang Y. Huang, Ilesanmi Adesida, Ralph G. Nuzzo & John A. Rogers, "Transfer printing by kinetic control of adhesion to an elastomeric stamp", Nature Materials Volume 5, 33-38 (2006)

SUMMARY OF INVENTION

Technical Problem

However, the above configuration has a problem in which it has been very difficult and time-consuming to optimize the adjustment of the physical properties of the silicone-based rubber film to meet the requirements from the object to be transferred or transfer conditions in optimizing the temporary adhesive strength of the surface of the silicone-based rubber film stamp. Also, in some cases, it has been impossible to achieve such optimization.

The present invention has been made to solve the above problems. An object of the present invention is to provide a microstructure-transfer stamp component that can optimize the temporary adhesive strength of the surface of the silicone-based rubber film stamp in a short period of time.

Solution to Problem

To solve the above problems, a first aspect of the present invention provides a microstructure-transfer stamp component comprising a substrate and a silicone-based rubber film formed on the substrate, wherein a surface of the silicone-based rubber film facing away from the substrate has one or more recesses each being closed except for a surface opening.

With this configuration, by using a silicone-based rubber film with greater pressure-sensitive adhesive strength than required temporary adhesive strength and forming one or more closed recesses on a surface thereof, an adjustment is possible so as to reduce a surface area where the microstructure, which is an object to be transferred, is in contact with the silicone-based rubber film. This eliminates the need for performing a detailed optimization of the pressure-sensitive adhesive strength (which depends on hardness, surface adhesion, tackiness, etc. of silicone-based rubber) via a composite optimization for changing physical properties of the silicone-based rubber film, so that an optimization of the temporary adhesive strength of the surface to be in contact with the microstructure is possible via design modifications to optimize the shape, opening area (size and number), and layout of the closed recess. In other words, the first aspect of the present invention provides a microstructure-transfer stamp component that can optimize the temporary adhesive strength of the surface of the silicone-based rubber film stamp in a short period of time. Also, the use of the inventive stamp component allows for transfer of multiple or a large number of microstructures at once, as well as a single microstructure.

Additionally, with the above configuration, upon temporary adhesion between the microstructure and the surface of the silicone-based rubber film including the closed recess, the closed recess defines a closed space. Since the pressing is performed with an optimized pressing amount for temporary adhesion, the closed space in the closed recess is subjected to reduced pressure upon the temporary adhesion. As a result, when the volume of the recess space is small, a suction force, albeit being weak, acts on the microstructure, which can stabilize the adhesion condition.

A shape of the surface opening of the closed recess may be selected from, for example, a group consisting of: circles, ellipses, rings, and polygons.

The surface opening shape of the closed recess may be any closed shape as long as the closed recess has a closed shape.

It is preferable that a depth of the closed recess do not reach the substrate.

With this configuration, the silicone-based rubber film and the substrate are adhered and secured to each other over their entire surfaces, and the durability is improved. As a result, the frequency of replacing the inventive stamp components can be reduced, and the productivity of microstructure transfer can be improved.

A plurality of the closed recesses may be arranged in a matrix on the surface of the silicone-based rubber film.

With this configuration, the temporary adhesion surfaces of the microstructure and the silicone-based rubber surface including the closed recess can be adhered to each other and held under a uniform force.

A plurality of the closed recesses may be arranged in a geometric pattern on the surface of the silicone-based rubber film.

With this configuration, the closed recesses with optimized layout can be formed according to the shape of the temporary adhesion surface of the microstructure, which is the adherend.

A portion of the surface of the silicone-based rubber film other than the closed recess may be in the form of a grid pattern.

With this configuration, a large recess surface opening can be formed, which enables optimization to produce desired, relatively weak temporary adhesive strength even with the use of silicone-based rubber with very strong pressure-sensitive adhesive strength or, in particular, very strong adhesion, through optimization of the opening area (size and number) of the closed recess.

A portion of the surface of the silicone-based rubber film other than the closed recess may have a honeycomb structured sectional pattern With such a configuration, too, the surface to be temporarily adhered to the microstructure has a regular layout as with the grid pattern, so that uniform temporary adhesive strength is generated on the temporary adhesion surface of the microstructure. As a result, a stable transfer operation can be provided.

The closed recess on the surface of the silicone-based rubber film may at least comprise a ring-shaped recess.

By virtue of this configuration, stable temporary adhesive strength can be developed when temporarily adhering microstructures having highly symmetric surfaces, such as squares and circles.

The closed recess may comprise a first closed recess and a second closed recess with different surface opening areas, and the surface opening area of the second closed recess may be smaller than the surface opening area of the first closed recess.

With this configuration, the adhesion area to the microstructure can be adjusted with both of the first closed recess and the second closed recess with a smaller surface opening area than the first closed recess. That is, the adhesive strength can be roughly adjusted with the relatively large, first closed recess, and the adhesion area and adhesive strength can be fine-tuned with the second closed recess with a smaller surface opening area than the first closed recess. In cases where the second closed recess with a smaller surface opening area than the first closed recess has a minute opening depth, a suction force, albeit being weak, acts on the microstructure within the closed space defined by the adhesion surface between the second closed recess with a smaller surface opening area than the first closed recess and the microstructure, as mentioned earlier with respect to the surface opening shape of the closed recess, and this can stabilize the adhesion condition.

A second aspect of the present invention provides a microstructure-transfer stamp component comprising a substrate and a silicone-based rubber film formed on the substrate, wherein one or more protrusions are formed on a surface of the silicone-based rubber film facing away from the substrate, and a surface of the protrusion has one or more recesses each being closed except for a surface opening.

With this configuration, the temporary adhesive strength of the surface of the silicone-based rubber film provided with the protrusion to be in contact with the microstructure can be optimized by virtue of the optimization of the shape, opening area (size and number), and layout of the closed recess provided on the surface of the protrusion. In other words, the second aspect of the present invention can provide a microstructure-transfer stamp component that can optimize the temporary adhesive strength of the surface of the silicone-based rubber film stamp in a short period of time. In addition, the use of the inventive stamp component allows for selective pickup of a single microstructure or a large number of microstructures from a certain region in a donor part, which is densely populated with many microstructures, without involving any contact with adjacent microstructures.

Additionally, with the above configuration, upon temporary adhesion between the microstructure and the surface of the protrusion including the closed recess, the closed recess defines a closed space. Since the pressing is performed with an optimized pressing amount for temporary adhesion, the closed space in the closed recess is subjected to reduced pressure upon the temporary adhesion. As a result, when the volume of the recess space is small, a suction force, albeit being weak, acts on the microstructure, which can stabilize the adhesion condition.

The protrusion may comprise two or more tiers of protruding elevations, and an uppermost surface of the two or more tiers of protruding elevations may have the one or more closed recesses.

With this configuration, the temporary adhesive strength of the silicone-based rubber film surface, which is to be in contact with the microstructure, on the uppermost surface of the two or more tiers of protruding elevations can be optimized by virtue of optimization of the shape, opening area (size and number), and layout of the closed recess provided on the uppermost surface of the two or more tiers of protruding elevations. In addition, the use of such a stamp component allows for selective pickup of an even smaller single microstructure or an even smaller microstructure(s) in a certain region from a donor part, which is densely populated with many such microstructures, without involving any contact with adjacent microstructures.

It is preferable that the closed recess have a bottom with curvature.

This configuration allows the entire bottom of the closed recess to be temporarily adhered to the microstructure, rendering the entire surface of the closed recess under a vacuum. As a result, the shape-recoverability of the closed recess develops a suction force on the adhesion surface, enabling temporary adhesion of the microstructure even with weak adhesion of the silicone-based rubber film. When the adhesion of the silicone-based rubber film is strong, it can be easily adjusted by reducing the adhesion area of the protrusion.

For example, the bottom of the closed recess may be spherical or aspherical.

With this configuration, the microstructure and the bottom of the closed recess formed on the surface of the protrusion can be temporarily adhered to each other under a small deformation.

For example, a shape of the surface opening of the closed recess may be a circle or an ellipse.

With this configuration, the bottom shape of the closed recess can be a part of a spherical surface or a part of an elliptical surface.

In cases where a shape of the surface opening of the closed recess is a polygon, it is preferable that a vertex of the polygon be arc-shaped.

This configuration can eliminate angle inflection points at the vertex, improving vacuum-holding ability during adhesion between the surface of the microstructure and the bottom of the closed recess formed on the protrusion surface.

It is preferable that a plurality of the protrusions be formed on the surface of the silicone-based rubber film, and the plurality of the protrusions may be arranged in a matrix in an X direction and a Y direction respectively at predetermined pitches.

This configuration allows for simultaneous transfer of microstructures in a batch onto a regular layout in the case of, for example, electrical and electronic equipment or 3D packages. In the case of micro LED displays, this configuration allows for transfer and arrangement of micro LEDs onto a backplane substrate at once by configurating the matrix at display pixel pitches of the display. In this way, this configuration is extremely useful for arranging microstructures in a matrix at predetermined desired pitches.

It is preferable that the protrusion have a multi-tiered shape formed of circular pillars, polygonal pillars, frustums, or a combination thereof.

With smaller pitches of the matrix, the protrusion needs to be made small so as not to interfere with adjacent microstructures. This leads to the problem of the decline in mechanical strength of the protrusion. Reinforcement of the mechanical strength of the protrusion without lowering the height thereof can be achieved by reducing the size (width, thickness) of the elevations in stages while mainlining the same height. In such cases, the protrusion can be implemented by combining pillar shapes and frustum shapes.

It is preferable that a cross-sectional shape of the protrusion in a height direction define an inwardly protruding shape of the protrusion.

Such an inwardly protruding shape for the cross-sectional shape of the protrusion in a height direction, namely for the cross-sectional profile of the protrusion in a plane perpendicular to the substrate, facilitates avoiding interference with adjacent chips. This configuration is suitable for cases where the protrusion is relatively large.

Alternatively, the cross-sectional shape of the protrusion in the height direction may define an outwardly protruding shape of the protrusion.

This configuration is effective for obtaining the mechanical strength of the protruding elevation in cases where it is relatively small.

It is preferable that a conductive film be formed between the substrate and the silicone-based rubber film.

This configuration can reduce electrostatic adsorption of particles, such as dust, generated in the transfer machine, as compared to the absence of the conductive film, during operations to transfer microstructures by using the inventive stamp component.

Alternatively, it is more preferably that the silicone-based rubber film be a conductive film.

This can eliminate a process of forming an extra conductive film and, moreover, reduce electrostatic adsorption of particles, such as dust, generated in the transfer machine.

For example, the substrate may be a quartz substrate.

The quartz substrate is more preferably a synthetic quartz substrate.

The use of a synthetic quartz substrate dramatically improves the flatness of the substrate, which in turn greatly improves the surface flatness of the silicone-based rubber film. As a result, this dramatically improves the transfer performance of the microstructure transfer apparatus.

Alternatively, the substrate may be a sapphire substrate.

As a sapphire substrate has greater mechanical strength than quartz (including synthetic quartz) substrates, this configuration can provide a microstructure-transfer stamp component with excellent durability.

Alternatively, the substrate may be a silicon wafer or a silicon wafer piece.

This configuration can provide a microstructure-transfer stamp component with more excellent flatness than that provided by synthetic quartz substrates.

Advantageous Effects of Invention

As described above, the microstructure-transfer stamp component in accordance with the first aspect of the present invention includes a substrate and a silicone-based rubber film formed on the substrate, where a surface of the silicone-based rubber film facing away from the substrate has one or more recesses each being closed except for a surface opening. Thus, the microstructure-transfer stamp component can adjust and optimize the adhesive strength (adhesion and tackiness) of the silicone-based rubber film not only through adjustment of the film compositions but also through adjustment of the opening area (size and number) and pattern layout of the closed recess. In other words, the first aspect of the present invention can provide a microstructure-transfer stamp component that can optimize the temporary adhesive strength of the surface of the silicone-based rubber film in a short period of time. In addition, by virtue of having one or more recesses each being closed except for a surface opening, a suction force provided by pressure reduction of the closed recess(es) can also be utilized as a factor for controlling the temporary adhesive strength of the stamp.

The microstructure-transfer stamp component in accordance with the second aspect of the present invention includes a substrate and a silicone-based rubber film formed on the substrate, where one or more protrusions are formed on a surface of the silicone-based rubber film facing away from the substrate, and a surface of the protrusion has one or more recesses each being closed except for a surface opening. Thus, the microstructure-transfer stamp component can temporarily adhere and transfer a microstructure by using one or more protrusions. A single protrusion configuration is useful for repair purposes. Meanwhile, it is also possible to transfer a large number of microstructures at once by using a large number of protrusions. Furthermore, it is also possible to transfer a large number of microstructures at once by using one protrusion for each microstructure. Further, arranging the protrusions in a pattern layout desired for a transfer destination, e.g., in a matrix pattern at pixel pitches in the case of displays, enables batch transfer of microstructures in the desired pattern layout.

Should be noted that the temporary adhesive strength can be adjusted and optimized through adjustment of the adhesive strength (adhesion and tackiness), derived from the film compositions, on the protrusion surface made of a silicone-based rubber film and adjustment of the area (size and number) of the closed recess. In other words, the second aspect of the present invention can provide a microstructure-transfer stamp component that can optimize the temporary adhesive strength of the surface of the silicone-based rubber film in a short period of time. In addition, the inventive microstructure-transfer stamp component is effective for cases where microstructures are densely arranged and where every few microstructures on the donor substrate are to be transferred.

In the microstructure-transfer stamp component in one embodiment according to the second aspect of the present invention, the protrusion includes two or more tiers of protruding elevations, and the uppermost surface of the two or more tiers of protruding elevations has the one or more closed recesses. Thus, the microstructure-transfer stamp component can provide the mechanical strength of the protrusion required for transfer and the durability during transfer operations, even when the size of microstructures is of the order of 100 μm or even 10 μm.

In the microstructure-transfer stamp component in another embodiment according to the second aspect of the present invention, the closed recess has a bottom with curvature. This allows the recess bottom to be adhered to the adhesion surface of the microstructure without any gap in between upon the temporary adhesion of the microstructure. As a result, a maximum adsorption force can be obtained from the closed recess, which can generate great temporary adhesive strength in addition to the adhesive strength of the silicone-based rubber film, despite the adsorption surface being small.

As such, it is possible to significantly improve the adjustment window for the adhesive strength of one silicone-based rubber film by providing a closed recess on the surface of the silicone-based rubber film or on the surface of the protrusion, which are to be temporarily adhered to microstructures, and adjusting the shape, opening area (size and number), layout and adsorption force of the closed recess as well as the composition and physical properties of the silicone-based rubber film. As a result, this offers a significant contribution to improving industrial productivity.

BRIEF DESCRIPTION OF DRAWINGS

FIG. 1 illustrates an example structure of a microstructure-transfer stamp component, presenting a first embodiment of the present invention;

FIG. 2 illustrates effects of an example closed recess of the microstructure-transfer stamp component in the first embodiment of the present invention;

FIG. 3 illustrates another example structure of the microstructure-transfer stamp component in the first embodiment of the present invention;

FIG. 4 illustrates another example structure of the microstructure-transfer stamp component in the first embodiment of the present invention;

FIG. 5 illustrates an example structure of the microstructure-transfer stamp component, presenting a second embodiment of the present invention;

FIG. 6 illustrates another example structure of the microstructure-transfer stamp component, presenting the second embodiment of the present invention;

FIG. 7 illustrates another example structure of the microstructure-transfer stamp component, presenting the second embodiment of the present invention;

FIG. 8 illustrates a structure of the microstructure-transfer stamp component, presenting a third embodiment of the present invention;

FIG. 9 illustrates a structure of the microstructure-transfer stamp component, presenting a fourth embodiment of the present invention;

FIG. 10 illustrates a structure of the microstructure-transfer stamp component, presenting a fifth embodiment of the present invention;

FIG. 11 illustrates a structure of the microstructure-transfer stamp component, presenting a sixth embodiment of the present invention;

FIG. 12 illustrates a structure of the microstructure-transfer stamp component, presenting a seventh embodiment of the present invention;

FIG. 13 illustrates a structure of the microstructure-transfer stamp component, presenting an eighth embodiment of the present invention;

FIG. 14 illustrates a structure of the microstructure-transfer stamp component, presenting a ninth embodiment of the present invention;

FIG. 15 illustrates a structure of the microstructure-transfer stamp component, presenting a tenth embodiment of the present invention;

FIG. 16 illustrates a structure of the microstructure-transfer stamp component, presenting an eleventh embodiment of the present invention;

FIG. 17 illustrates a structure of the microstructure-transfer stamp component, presenting a twelfth embodiment of the present invention;

FIG. 18 illustrates a structure of the microstructure-transfer stamp component, presenting a thirteenth embodiment of the present invention;

FIG. 19 illustrates a structure of the microstructure-transfer stamp component, presenting a fourteenth embodiment of the present invention; and FIG. 20 illustrates an example structure of a microstructure-transfer stamp component of conventional art.

DESCRIPTION OF EMBODIMENTS

As described above, a need has existed for development of a microstructure-transfer stamp component that can optimize the temporary adhesive strength of the surface of the silicone-based rubber film stamp in a short period of time.

The present inventors have earnestly studied to achieve the above object and consequently found that it is possible to significantly improve the adjustment window for the adhesive strength of one silicone-based rubber film by providing a closed recess on a surface of the silicone-based rubber film or on a surface of the protrusion, which are to be temporarily adhered to a microstructure, and adjusting the shape, opening area (size and number), layout and adsorption force of the closed recess as well as the composition and physical properties of the silicone-based rubber film. This finding has led to the completion of the present invention.

That is, the present invention is a microstructure-transfer stamp component including a substrate and a silicone-based rubber film formed on the substrate, where a surface of the silicone-based rubber film facing away from the substrate has one or more recesses each being closed except for a surface opening.

Also, the present invention is a microstructure-transfer stamp component including a substrate and a silicone-based rubber film formed on the substrate, where one or more protrusions are formed on a surface of the silicone-based rubber film facing away from the substrate, and a surface of the protrusion has one or more recesses each being closed except for a surface opening.

Hereinafter, the present invention will be described in detail, but the present invention is not limited to the following description.

First Embodiment

FIG. 1 illustrates an example structure of a microstructure-transfer stamp component, presenting a first embodiment of the present invention. FIG. 1(*a*) is a cross-sectional view of the microstructure-transfer stamp component 100, and FIG. 1(*b*) is a top view of the microstructure-transfer stamp component 100. The cross-sectional view (a) illustrates a cross-sectional structure along the plane P-Q in the top view (b). In FIG. 1, reference numeral 1 refers to a substrate (e.g., a quartz substrate), reference numeral 2 refers to a silicone-based rubber film, and reference numeral 3 refers to a closed recess formed on a surface (a silicone-based rubber film surface facing away from the substrate 1) 2*a* of the silicone-based rubber film 2. As shown in FIG. 1, the closed recess 3 is closed except for a surface opening 3*a*. Also, as shown in FIG. 1(*b*), a plurality of the closed recesses 3 are arranged in a matrix on the silicone-based rubber film surface 2*a*.

In FIG. 1(*b*), the surface opening shape of the closed recess 3 is illustrated as being square. The surface opening shape of the closed recess 3 is not limited to squares and may be any closed shape including circles, ellipses, rings, or polygons such as triangles, oblongs (rectangles), and hexagons.

FIG. 2 illustrates effects of an example closed recess of the microstructure-transfer stamp component in the first embodiment of the present invention. FIG. 2(*a*) is a bottom view depicting only the microstructure-transfer stamp component 100 of this example, and FIGS. 2(*b*) and (*c*) are cross-sectional views thereof. The cross-sectional views (b) and (c) each illustrate a cross-section along the plane P-Q in the bottom view (a), illustrating a microstructure 4 as being temporarily adhered to the silicone-based rubber film surface 2*a*. FIG. 2(*b*) shows a case where the microstructure 4 has a smaller surface than the surface 2*a* of the silicone-based rubber film 2, while FIG. 2(*c*) shows a case where the microstructure 4 has a larger surface than the surface 2*a* of the silicone-based rubber film 2. The microstructure-transfer stamp component 100 shown in FIG. 2 is similar to the microstructure-transfer stamp component 100 shown in FIG. 1.

Effects of the closed recess 3 will be described with reference to FIG. 2(*b*). Given an adhesion area between the silicone-based rubber film 2 and the microstructure 4 as S and a total surface area of the closed recess 3 as A, an actual temporary adhesion area is (S−A). Generally, the temporary adhesive strength of silicone-based rubber films mainly originates from adhesion and pressure-sensitive adhesive strength. That is, the temporary adhesive strength is the sum of the adhesion of the surface 2*a* of the silicone-based rubber film 2 and the tackiness, which is generated in dependence on the amount of displacement of the silicone-based rubber surface 2*a* during pressing of the microstructure 4 and the silicone-based rubber film 2 on each other. Since the temporary adhesive strength is generated in the temporary adhesion surface between the silicone-based rubber film 2 and the microstructure 4, the temporary adhesive strength largely depends on the temporary adhesion area S.

FIG. 2 illustrates the case of transferring a single microstructure 4 for the purpose of explaining the effects of the closed recess 3. However, when transferring a large number of microstructures at once too, the temporary adhesive strength can be adjusted by adjusting the shape, opening area (size and number), and layout of the closed recess while taking similar effects of the temporary adhesion area into account.

FIG. 3 illustrates a structure of the closed recess in another example of the microstructure-transfer stamp component in the first embodiment of the present invention. FIG. 3(*a*) is a cross-sectional view of the microstructure-transfer stamp component 100 of this example, and FIG. 3(*b*) is a top view thereof. The cross-sectional view (a) illustrates a cross-sectional structure along the plane P-Q in the top view (b). A distinction from FIG. 2 resides in the layout of the closed recesses 3. In FIG. 3, the layout of the matrix pattern of the closed recesses 3 is rotated by 45 degrees relative to that of FIG. 2.

FIG. 4 illustrates a structure of the closed recess in another example of the microstructure-transfer stamp component in the first embodiment of the present invention. FIG. 4(*a*) is a cross-sectional view of the microstructure-transfer stamp component 100 of this example, and FIG. 4(*b*) is a top view thereof. The cross-sectional view (a) illustrates a cross-sectional structure along the plane P-Q in the top view (b). Distinctions from FIG. 2 reside in that a plurality of closed recesses 5 with a circular surface opening are formed on the silicone-based rubber film surface 2*a* and in the layout of the closed recesses 5. In FIG. 4, the closed recesses 5 are laid out on concentric hexagonal patterns. Laying out (arranging) the closed recesses 5 in a geometrical pattern(s) in this manner can build a regular pattern layout with some symmetry.

In the present invention, upon the temporary adhesion between the microstructure and the silicone-based rubber surface including the closed recess, the closed recess defines a closed space. Since the pressing is performed with an optimized pressing amount for the temporary adhesion, the closed space in the closed recess is subjected to reduced pressure upon the temporary adhesion. As a result, when the volume of the recess space is small, a suction force, albeit being weak, acts on the microstructure, which can stabilize the adhesion condition.

As in the examples shown in FIGS. 1-4 for example, the depth of the closed recess preferably does not reach the substrate.

This ensures that the silicone-based rubber film and the substrate are adhesively secured to each other over their entire surfaces, improving the durability. As a result, this can reduce the frequency of replacing the inventive stamp components, improving the productivity of microstructure transfer.

Second Embodiment

A second embodiment of the present invention will be described below with reference to the drawings.

FIG. 5 illustrates an example structure of the microstructure-transfer stamp component 100, presenting the second embodiment of the present invention. FIG. 5(*a*) is a cross-sectional view, and FIG. 5(*b*) is a top view.

A distinction from the first embodiment resides in that a surface opening 6*a* of a closed recess 6 has a relatively larger size. With such a configuration, turning to a portion 2*b* of the surface 2*a* of the silicone-based rubber film 2 rather than the closed recesses 6, the remaining portion 2*b* of the silicone-based rubber film surface 2*a* is in the form of a grid pattern as shown in FIG. 5(*b*). The structure of the stamp component 100 with such a large total opening area of the closed recesses 6 is suited for use with a silicone-based rubber film 2 that has stronger pressure-sensitive adhesive strength or adhesion than an optimized value in the absence of any closed recess 6. In such cases, optimizing the opening area (size and number) of the closed recesses 6 can facilitate optimization to produce desired temporary adhesive strength. In other words, even with the use of the silicone-based rubber film 2 with strong pressure-sensitive adhesive strength or strong adhesion, employing the second embodiment of the present invention can adjust the temporary adhesive strength of the silicone-based rubber film 2 over a substantially wide range.

FIG. 6 illustrates another example structure of the microstructure-transfer stamp component 100, presenting the second embodiment of the present invention. FIG. 6(*a*) is a cross-sectional view, and FIG. 6(*b*) is a top view. A distinction from FIG. 5 resides in that a closed recess 7 in FIG. 6 has a rectangular surface opening, in contrast to the square surface opening of the closed recess 6 in FIG. 5. The total area of the closed recesses can also be adjusted by modifying the shape in this manner.

FIG. 7 illustrates another example structure of the microstructure-transfer stamp component 100, presenting the second embodiment of the present invention. FIG. 7(*a*) is a cross-sectional view, and FIG. 7(*b*) is a top view. The pattern layout of closed recesses 8 of FIG. 7 is a θ rotation of all closed recesses 7 of FIG. 6 and is a kind of grid patterns. Increasing θ further can form a layout pattern where the closed recesses are connected together, i.e., the recesses in a zig-zag pattern and in a single horizontal line. Accordingly, these layout patterns can be recognized as derivative layouts of grid patterns.

Should be noted that in FIGS. 5-7, each cross-sectional view (a) illustrates a cross-sectional structure along the plane P-Q of the top view (b).

In the case of the grid-shaped recess pattern layout as in the second embodiment of the present invention, a closed space is also formed between the closed recess and the microstructure when the silicone-based rubber film is temporarily adhered. The suction effect on the microstructure will be small if the volume of the closed space is large because of a large pattern size or a large depth. However, reducing the pattern size leads to a reduced volume of the closed space, as a result of which the suction effect on the microstructure can be expected.

The portion of the silicone-based rubber film surface other than the closed recess may have a honeycomb structured sectional pattern.

With such a configuration, too, the surface to be temporarily adhered to the microstructure has a regular layout as with the grid pattern, so that uniform temporary adhesive strength is generated on the temporary adhesion surface of the microstructure. As result, this can provide a safe transfer operation.

As described above, when the area of the closed space is small and a closed space with a small volume is formed upon the temporary adhesion between the microstructure and the silicone-based rubber film surface including the recess, the closed space in the closed recess is subjected to reduced pressure during pressing with an optimized pressing amount for temporary adhesion, which brings about a suction force on the microstructure. While a force generated from a single one of these closed recesses is weak, it can be significant when the number of recesses is extremely large. Therefore, it is possible to control both of the effect of weakening the pressure-sensitive adhesive strength by providing the closed recesses and the effect of strengthening the adhesive strength with the suction force of the closed recesses. The suction force of the closed recesses also creates a stabilizing effect for the adhesion condition.

While the stamp component of the second embodiment of the present invention is applicable to transfer of microstructures of any size, it is particularly suitable for transferring microstructures as large as or larger than the size of the silicone-based rubber film serving as the stamp. For example, it is suitable for mounting relatively large thin-film chips such as semiconductor LSIs.

Third Embodiment

FIG. 8 illustrates a structure of the microstructure-transfer stamp component 100, presenting a third embodiment of the present invention. FIG. 8(*a*) is a cross-sectional view, and FIG. 8(*b*) is a top view. The cross-sectional view (a) illustrates a cross-sectional structure along the plane P-Q in the top view (b).

In FIG. 8, reference numeral 9 refers to each of closed recesses with a ring-shaped surface opening, and the closed recesses are concentric annular recesses. There may be one or more annular (ring-shaped) closed recesses 9. An important aspect of the present embodiment is that the recess 9 is closed except for the surface opening. When the annular zone of the closed recess 9 has a small width, a suction force can be expected from the recess 9. Optimizing the depth of the closed recess 9 is also important to further increase this effect. In other words, it is important that the depth is selected so as to ensure that reduction in the recess volume leads to generation of the suction force.

While FIG. 8 depicts at the center a closed recess 3 with a circular surface opening, the circular recess at the center may or may not be provided in the embodiment of the present invention.

Fourth Embodiment

FIG. 9 illustrates a structure of the microstructure-transfer stamp component 100, presenting a fourth embodiment of the present invention.

In FIGS. 9(*a*) and (*b*), reference numerals 6 and 9 each refer to a first recess provided on the surface 2*a* of the silicone-based rubber film 2. Reference numeral 11 refers to a second recess, which is a recess provided on portions of the silicone-based rubber film surface 2*a* other than the first closed recess 6 or 9 and having a smaller diameter (surface opening area) than the first closed recess 6 or 9. The second recess 11 is also closed except for the surface opening. The embodiment of the present invention makes it possible to, for example, roughly adjust the temporary adhesive strength with the first closed recess and then fine-tune the temporary adhesive strength with the second closed recess.

FIG. 9(*c*) illustrates an example variation of the structure of the microstructure-transfer stamp component 100, presenting the forth embodiment of the present invention.

In FIG. 9(*c*), reference numeral 11*a* refers to a recess, similar to the second recess 11 shown in FIGS. 9(*a*) and (*c*), that is provided on the silicone-based rubber film surface 2*a* and closed except for the surface opening. In FIG. 9(*c*), reference numeral 10 refers to a groove-shaped recess provided on portions of the silicone-based rubber film surface 2*a* other than the recess 11*a*. In FIG. 9(*c*), the direction of the groove of the recess 10 is illustrated as being rotated by θ degrees relative to one edge of the silicone-based rubber film 2. The value of θ may be any angle from 0 to 360 degrees. The inner shape of the recess 10 may be wavy, zigzag, or any other layout shape.

Fifth Embodiment

FIG. 10 illustrates a structure of the microstructure-transfer stamp component 100, presenting a fifth embodiment of the present invention. FIG. 10(*a*) is a cross-sectional view, and FIGS. 10(*b*) and (*c*) are top views. The cross-sectional view (a) illustrates a cross-sectional structure along the plane P-Q of the top view (b). FIG. 10(*c*) is a partial enlarged view of FIG.

In FIG. 10, reference numeral 12 refers to a protrusion provided on the surface 2*a* of the silicone-based rubber film 2. The protrusion 12 is made of the same silicone-based rubber film as the silicone-based rubber film 2. Reference numeral 13 refers to a recess provided on a protrusion surface 12*a*. As shown in FIG. 10(*c*), the closed recess 13 is closed except for a surface opening 13*a*.

The microstructure-transfer stamp component 100 provided with a single protrusion 12 as shown in FIG. 10 is useful for transferring a single microstructure of the order of as small as millimeters, 100 μm, or even 10 μm. In such cases, the surface 12*a* of the protrusion 12, or the size of the adhesion surface, may be formed to be about as large as the microstructure. More preferably, the surface 12*a* may be formed somewhat larger than the microstructure. This can stabilize the adhesion around the periphery of the microstructure. Though depending on positional precision of the transfer apparatus, for microstructures of 10 μm to 100 μm, it is preferred that the surface 12*a* of the protrusion 12 is sized even larger to accommodate positional precision errors of the transfer apparatus.

The use of the stamp of the present embodiment can optimize the temporary adhesive strength of the protrusion 12, which is to be actually adhered to the microstructure, as a function of the size (opening area, depth), number, and layout of the closed recess 13 provided on the protrusion surface 12*a*.

In such cases, adjusting the closed recess 13 formed on the protrusion surface 12*a* such that the suction force is generated by the closed recess 13 can improve the stability of the temporary adhesion between the adhesion surface of the microstructure and the protrusion surface 12*a*.

In addition, the use of the microstructure-transfer stamp component 100 of the present embodiment allows for selective pickup of a single microstructure or a microstructure(s) in a certain region from a donor part, which is densely populated with many microstructures, without involving any contact with adjacent microstructures, so that the stamp component can be positioned more closely to the donor side.

The microstructure-transfer stamp component 100 with the single protrusion 12 according to the fifth embodiment of the present invention is useful for transferring one microstructure at a time, and is especially essential for repair purposes.

Sixth Embodiment

FIG. 11 illustrates a structure of the microstructure-transfer stamp component 100, presenting a sixth embodiment of the present invention. FIGS. 11(*a*), (*e*), and (*f*) are cross-sectional views, and FIGS. 11(*b*)-(*d*) are top views. The cross-sectional view (a) illustrates a cross-sectional structure along the plane P-Q in the top view (b). FIGS. 11(*c*) and (*d*) are enlarged views of respective different portions in FIG. 11(*b*). FIG. 11(*e*) illustrates a cross-sectional structure along the plane R-S in FIG. 11(*c*). FIG. 11(*f*) illustrates a cross-sectional structure along the plane R'-S' in FIG. 11(*d*).

In FIG. 11, reference numeral 14 refers to a protrusion provided on the surface 2*a* of the silicone-based rubber film 2; the figure shows the case where two or more protrusions 14 are provided. The protrusion 14 is made of the same silicone-based rubber film as the silicone-based rubber film 2. Reference numeral 15 refers to a closed recess provided on a surface 14*a* of the protrusion 14. As shown in FIGS. 11(*c*) and (*d*), the closed recess 15 is closed except for a surface opening 15*a*.

FIGS. 11(*c*) and (*e*) show an example where a single closed recess 15 is provided on the protrusion 14. In contrast, FIGS. 11(*d*) and (*f*) show an example where two or more closed recesses 15 are provided on the protrusion 14. In both cases of FIGS. 11(*c*) and (*d*), the temporary adhesive strength can be easily adjusted through optimized designing of the size and number of the protrusions 14 as well as the size and number of the closed recesses 15.

While the illustration of FIG. 11 depicts forty-nine (7×7 matrix) protrusions 14 due to physical illustration constraints, miniaturizing every one of the protrusions 14 to form a stamp component 100 with thousands or tens of thousands of protrusions 14 will inevitably result in the size of the protrusions 14 and spacing therebetween being of the order of microns. It will be readily inferred that the size of the closed recess 15 provided on the surface 14*a* of the protrusion 14 of the order of microns is naturally smaller than the scale of the protrusion 14. Using the stamp configured as such, the adsorption force of the closed recesses 15 can be greatly utilized to transfer a large number of microstructures at once, offering a stable transfer.

Seventh Embodiment

FIG. 12 illustrates a structure of the microstructure-transfer stamp component 100, presenting a seventh embodiment of the present invention. FIG. 12(*a*) illustrates a cross-sectional structure of the microstructure-transfer stamp component 100 of a first example, and FIG. 12(*b*) is a top view of a protrusion 12 shown in FIG. 12(*a*). FIG. 12(*c*) illustrates a cross-sectional structure of the microstructure-transfer stamp component 100 of a second example, and FIG. 12(*d*) is a top view of a protrusion 12 shown in FIG. 12(*c*).

In FIG. 12, reference numeral 16 refers to a first protruding elevation provided on the surface of the silicone-based rubber film 2, and reference numeral 17 refers to a second protruding elevation provided on the first protruding elevation 16. The protrusion 12 shown in FIG. 12 includes the first protruding elevation 16 and the top tiered, second protruding elevation 17. That is, the protrusion 12 shown in FIG. 12 has an elevation structure (two-tiered protruding elevation) having two tiers of protruding shapes. The first protruding elevation 16 and the second protruding elevation 17 are made of the same silicone-based rubber film as the silicone-based rubber film 2. Reference numeral 18 refers to a closed recess provided on a surface of the second protruding elevation 17.

In the first example shown in FIGS. 12(*a*) and (*b*), the first protruding elevation 16 is provided on the surface 2*a* of the silicone-based rubber film 2, and the second protruding elevation 17 is provided on the protruding elevation 16, such that a single two-tiered protrusion 12 is formed. On the other hand, FIGS. 12(*c*) and (*d*) shows the case where the two-tiered protrusion 12 has the second protruding elevations 17 formed in a 3×3 matrix on the single first protruding elevation 16.

As shown in the fifth embodiment, the use of the stamp component 100 with the single protrusion 12 shown in FIG. 10 allows for selective pickup of a single microstructure or a microstructure(s) in a certain region from a donor part, which is densely populated with many microstructures, without involving any contact with adjacent microstructures, so that the stamp component can be positioned more closely to the donor side. However, if the size of the microstructures is of the order of 100 μm or even 10 μm, the adhesion surface of the protrusion of the stamp component needs to be sized to be almost the same as the microstructures. For example, the height of the protrusion with an adhesion surface of 50 μm may need to be 50 μm or two or more times that value to avoid interference with adjacent microstructures. In such cases, the protrusion would be prone to damages due to repeated use, such as bending and breaking, during pressing of the stamp. To accommodate such situations, the two-tiered protrusion structure as shown in the seventh embodiment may be employed to improve the strength and durability.

The microstructure-transfer stamp component with the protruding elevation as in the present embodiment is effective for cases where microstructures are densely arranged and where every few microstructures on the donor substrate are to be transferred.

As shown in FIGS. 12(*c*) and (*d*), configuring the stamp with two or more, and relatively few, second protruding elevations 17, which may cause durability issues, can also improve the durability of the stamp.

Eighth Embodiment

FIG. 13 illustrates a structure of the microstructure-transfer stamp component 100, presenting an eighth embodiment of the present invention. In FIG. 13, reference numeral 19 refers to a protrusion formed on the surface 2*a* of the silicone-based rubber film 2, and reference numeral 20 refers to a closed recess provided on a surface 19*a* of the protrusion 19. FIG. 13(*a*) is a cross-sectional view of the present embodiment, and FIG. 13(*b*) is a top view of the present embodiment. The cross-sectional view (a) illustrates a cross-sectional structure along the plane P-Q in the top view (b). FIG. 13(*c*) is an enlarged top view of the protrusion 19, and FIG. 13(*d*) is an enlarged cross-sectional view of the protrusion 19.

In this example, the protrusion 19 is in the form of a quadrangular prism, the closed recess 20 has a circular surface opening, and a bottom 20*a* of the closed recess 20 is a part of a spherical surface with curvature r.

Ninth Embodiment

FIG. 14 illustrates a structure of the microstructure-transfer stamp component, presenting a ninth embodiment of the present invention.

FIG. 14(*a*) is a top view of the protrusion 19, FIG. 14(*b*) is a cross-sectional view along the plane T-U in FIG. 14(*a*), and FIG. 14(*c*) is a cross-sectional view along the plane V-W in FIG. 14(*a*). The silicone-based rubber film and the substrate are not shown, and only the protrusion 19 formed on the surface of the silicone-based rubber film is shown. In FIG. 14, reference numeral 21 refers to a closed recess formed on the surface 19*a* of the protrusion 19.

As shown in FIG. 14(*a*), the surface opening of the closed recess 21 is generally of a square shape, with four vertex portions of the square each being a part of an arc with a radius of curvature r0. For example, one-fourth of the arc with the radius r0 may be used. This allows the arc and the edges of the square to share the same tangent line, which can reduce any deformation distortion during temporarily adhering the recess bottom 21*a* to the microstructure without any gap in between.

As shown in FIGS. 14(*b*) and (*c*), varying the radius of curvature of the bottom 21*a* of the closed recess 21 between the direction (T-U) perpendicular to the edges of the square and the diagonal direction (V-W) of the square to provide the same depth as viewed from the middle of the closed recess 21 can minimize any deformation of the closed recess 21 during temporarily adhering the recess bottom 21*a* to the microstructure without any gap in between. In such cases, of course, the bottom 21*a* of the recess 21 may be designed and formed to be smooth by optimizing intermediate values of the two radii of curvature r1 and r2, according to the rotational angle direction, between the (T-U) direction and the (V-W) direction. The temporary adhesive strength between the flat surface of the microstructure and the closed recess 21 on the protrusion surface 19*a* can be maximized by thus-utilizing the aspherical recess bottom structure.

Tenth Embodiment

FIG. 15 illustrates a structure of the microstructure-transfer stamp component 100, presenting a tenth embodiment of the present invention. In FIG. 15, reference numeral 22 refers to a protrusion formed on the surface 2*a* of the silicone-based rubber film 2, and reference numeral 23 refers to a closed recess formed on a protrusion surface 22*a*.

FIG. 15(*a*) is a cross-sectional view of the present embodiment, and FIG. 15(*b*) is a top view of the present embodiment. The cross-sectional view (a) illustrates a cross-sectional structure along the plane P-Q in the top view (b). FIG. 15(*c*) is an enlarged top view of the protrusion 22, and FIG. 15(*d*) is an enlarged cross-sectional view of the protrusion 22. In the present embodiment, a large number of protrusions 22 are formed in a matrix. In addition, in the present embodiment, each protrusion 22 is of a circular pillar shape, and its surface is formed with a recess bottom consisting of a part of a spherical surface with a radius of curvature r. This circular surface shape of the protrusion 22, i.e., the circular pillar shape or partially cut-out conical pillar shape of the protrusion 22 can reduce any deformation distortion of the closed recess 23 during temporarily adhering the microstructure and the recess bottom 23*a* without any gap in between. In other words, the shape-recoverability of the closed recess 23 can be made uniform after the temporary adhesion, which allows for maintaining the temporary adhesion in a stable manner. An elliptical surface shape of the protrusion 22 can also provide the same effect.

Although the example has been shown where the shape of the recess bottom 23*a* is a part of a spherical surface with a radius of curvature r, the bottom shape may be aspherical in the radial direction. For example, the recess bottom 23*a* may include a paraboloidal surface. More precisely, simulation may be used to design the best shape, while incorporating the physical properties of the silicone-based rubber film used, that ensures deformability during the temporary adhesion and optimal shape-recoverability after the temporary adhesion, i.e., the temporary adhesive strength (adhesion of the silicone-based rubber film+tackiness+adsorption force).

Eleventh Embodiment

FIG. 16(*a*) illustrates a structure of the microstructure-transfer stamp component 100, presenting an eleventh embodiment of the present invention. In the present embodiment, the basic structure as the stamp component is the same as that of the tenth embodiment of the present invention. A distinction resides in that, as shown in the top view of FIG. 16(*a*), the protrusions 22 are arranged in a matrix at certain pitches (Xp, Yp) that are required from placement locations for the receiving substrate.

Such arrangement and configuration of the protrusions for picking up microstructures in a matrix at desired pitches is suitable for electronics assembly and 3D mounting, where electrical and electronic components are arranged at certain pitches. In addition, the above arrangement and configuration is extremely useful for transfer and assembly of micro LEDs, which requires arranging LEDs at desired display pitches.

FIGS. 16(*b*) and (*c*) illustrate an operation of the microstructure-transfer stamp component 100, presenting the eleventh embodiment of the present invention. FIGS. 16(*d*) and (*e*) are enlarged cross-sectional views of respective different portions in FIG. 16(*c*).

In FIGS. 16(*b*)-(*e*), reference numeral 24 refers to a donor substrate for microstructures, and reference numerals 25 and 26 refer to microstructures. A distinction between the microstructure 25 and the microstructure 26 resides in their size; the figures show a case where the microstructure 25 is smaller than the area of the protrusion of the protrusion 22 while the microstructure 26 is larger than the area of the protrusion 22.

In FIG. 16(*b*), the microstructures are shown as being arranged in a desired matrix on the donor substrate 24, similarly to the protrusions 22. FIG. 16(*c*) shows the state where the microstructures 25 and 26 have been picked up from the donor substrate 24 by pressing of the microstructure-transfer stamp component 100 of the present embodiment onto the donor substrate 24. FIG. 16(*d*) is an enlarged view of the state where the microstructure 25 has been picked up, showing the microstructure 25 as being temporarily adhered to the bottom of the closed recess 23. FIG. 16(*e*) is an enlarged view of the state where the microstructure 26 has been picked up, showing the microstructure 26 as being temporarily adhered to the bottom of the closed recess 23.

As shown in FIG. 16(*d*), if the microstructure 25 is smaller than the protrusion 22, the microstructure 25 is temporarily adhered such that its periphery is enclosed in an overhanding manner. On the other hand, as shown in FIG. 16(*e*), if the microstructure 26 is larger than the protrusion 22, the entire recess bottom is adhered to the temporary-adhesion surface of the microstructure 26. In either case, temporary adhesion to the microstructures 25 and 26 can be performed like a so-called suction cup such that the space of the closed recess 23 that existed prior to the pickup of the protrusion 22 is eliminated.

In the first (FIG. 1) to seventh (FIG. 12) embodiments, the cavity in the closed recess does not completely disappear after the temporary adhesion of the microstructure, whereas designing the recess as in the eighth (FIG. 13) to eleventh (FIG. 16) embodiments of the present invention will create no cavity between the recess bottom and the adhesion surface of the microstructure.

Twelfth Embodiment

FIG. 17 illustrates some example structures of the microstructure-transfer stamp component 100, presenting a twelfth embodiment of the present invention. In particular, FIG. 17 illustrates a cross-section of the protrusion 12 in the planar direction perpendicular to the substrate 1, namely the height direction.

In FIG. 17, reference numerals 27, 28, and 30 refer to respective portions of the protrusion 12, and reference numeral 29 refers to a closed recess. Reference numeral 27 refers to a first tiered protruding elevation, reference numeral 28 refers to a second tiered protruding elevation, and reference numeral 30 refers to a third tiered protruding elevation.

FIG. 17(*a*) illustrates a form in which the protrusion 12 of a circular or polygonal pillar shape is configured with the two tiers of protruding elevations 27 and 28. FIG. 17(*b*) illustrates a configuration in which the first tiered protruding elevation 27 is of a circular or polygonal pillar shape, and the second tiered protruding elevation 28 of a circular or polygonal frustrum shape is formed atop the protruding elevation 27. FIG. 17(*c*) illustrates both of the two tiers of protruding elevations 27 and 28 as being configured with a circular or polygonal frustrum. Configuring the protrusion 12 with a multi-tiered protruding elevation in this manner will provide an effective means of improving the decline in mechanical strength of the protrusion 12 when it is miniaturized.

FIGS. 17(*d*) and (*e*) illustrate the protrusion 12 as being configured with three tiers of protruding elevations 27, 28, and 30 of a circular or polygonal frustrum shape. FIG. 17(*d*) illustrates a cross-sectional shape (profile), in the height direction, of the protrusion 12 that defines an inwardly protruding shape of the protrusion 12. FIG. 17(*e*) illustrates a cross-sectional shape (profile), in the height direction, of the protrusion 12 that defines an outwardly protruding shape of the protrusion 12.

The case of FIG. 17(*d*) is useful for transferring, with a relatively large-sized protrusion 12, a microstructure without interference with closely spaced adjacent microstructures, and is also useful when the protrusion 12 is close in distance to an adjacent protrusion 12. On the other hand, the case of FIG. 17(*e*) is useful for preventing the decline in mechanical strength of the protrusion 12 when it is smaller than several 100 μm.

Such multi-tiered configuration of the protrusion 12 by combining circular pillars, polygonal pillars, circular frustums, and polygonal frustums can greatly expand the design flexibility. For more advanced designing, simulation can be utilized to design a smoother profile shape that goes beyond combinations of multiple tiers.

Although in FIG. 17, the closed recess 29 is illustrated as having a spherical bottom, the effect of the cross-sectional profile of the protrusion 12 will take place regardless of the shape of the closed recess 29.

In the twelfth embodiment, the surface of the top tiered elevation 28 or 30 in the two or more tiers of protruding elevations has the closed recess 29, as shown in FIG. 17.

Thirteenth Embodiment

FIG. 18 illustrates some example structures of the microstructure-transfer stamp component 100, presenting a thirteenth embodiment of the present invention.

In FIG. 18, reference numeral 31 refers to a conductive film, which is formed between the substrate 1 and the silicone-based rubber film 2. FIGS. 18(*a*), (*c*), and (*e*) illustrate cases where the silicone-based rubber film 2 does not have any protrusion, while FIGS. 18(*b*), (*d*), and (*f*) illustrate cases where the silicone-based rubber film 2 has at least one protrusion 12. Although not shown, the surface **2*a* of each of the silicone-based rubber films 2 in FIGS. 18**(*a*), (*c*), and (*e*) and the surface **12*a* of the protrusion 12 in FIGS. 18**(*b*), (*d*), and (*f*) has a closed recess.

FIGS. 18(*a*) and (*b*) each illustrate a case where the silicone-based rubber film 2 is formed over a region smaller than the substrate 1 and the conductive film 31 is formed over the same region as the silicone-based rubber film 2. FIGS. 18(*c*) and (*d*) each illustrate a case where the conductive rubber film 31 is formed over one entire surface of the substrate 1. Of course, the conductive film 31 may be formed over a region larger than that of the silicone-based rubber film 2, if not over the entire one surface of the substrate 1. FIGS. 18(*e*) and (*f*) each illustrate a case where both of the silicone-based rubber film 2 and the conductive film 31 are formed over the entire one surface of the substrate 1.

It is extremely difficult to completely eliminate the risk of floating particles, caused by static electricity, attaching to the stamp component and thereby deteriorating the temporary adhesion between the stamp component and the microstructure, though this is a problem that will be sufficiently solved by using the inventive stamp component and controlling the installation environment of the transfer machine for transfer operations as well as the environment inside the apparatus. Forming the conductive film of the present embodiment between the substrate and the silicone-based rubber film is an extremely effective way to further mitigate this problem and increase the operating time of the transfer apparatus. The above configuration can greatly reduce adsorption of particles onto the adhesion surface caused by static electricity.

Thus, the above configuration can simultaneously allow for the feature of adjusting the adhesion of the silicone-based rubber film by the design of the closed recess and for reducing particles.

Fourteenth Embodiment

FIG. 19 illustrates some example structures of the microstructure-transfer stamp component 100, presenting a fourteenth embodiment of the present invention.

In FIG. 19, reference numeral 32 refers to a conductive silicone-based rubber film, and reference numeral 33-36 refer to protrusions of various variations. Although not shown, each of a surface **32*a* of the silicone-based rubber film 32 in FIG. 19**(*a*) and surfaces **33*a*, 34*a*, 35*a*, and 36*a* of the respective protrusions 33-36 in FIGS. 19**(*b*)-(*f*) has a closed recess.

The protrusions 34 and 35 in FIGS. 19(*d*) and (*e*) are illustrated as having a top tiered protruding elevation with a frustum cross-sectional shape.

The most significant feature of the present embodiment is that the silicone-based rubber film 32 itself is a conductive film. The silicone-based rubber film can be rendered conductive by mixing a carbon-based conductive film, such as carbon, carbon nanofiber, graphite, graphene, etc. as a filler.

In FIG. 19, the conductive silicone-based rubber film 32 is illustrated as being formed over a limited region of the substrate 1. However, the conductive silicone-based rubber film 32 may be formed over the entire substrate 1.

This configuration can reduce attachment, to the stamp component, of particles generated during transfer operations.

In the microstructure-transfer stamp component described in the above embodiments of the present invention, the surface opening of the closed recess may be of any closed shape, including circles, ellipses, and polygons such as triangles, rectangles (squares and oblongs), quadrangles, pentagons, and hexagons.

While the most convenient surface shape for the substrate and the silicone-based rubber film in terms of processability will be rectangles (squares or oblongs), their surfaces may be of any shape including circles, ellipses, and polygons such as triangles, quadrangles, and hexagons.

Formation of the aforementioned silicone-based rubber film will be described.

Formations of the flat silicone-based rubber film with a closed recess and the silicone-based rubber film with a protrusion and a closed recess on a surface thereof can be performed by using, for example, an imprinting method. The curing reaction of the silicone-based rubber film may be thermal curing or UV curing.

Other than the imprinting method, any method may be used that can form the inventive structure, without being limited to an injection molding method.

A quartz substrate may be used as the substrate in the inventive microstructure-transfer stamp component. Using a synthetic quartz substrate as the quartz substrate dramatically improves performance.

The use of the synthetic quartz substrate, which can provide in-plane uniformity (TTV: total thickness variation) of about 1 μm or less, can significantly improve the in-plane height uniformity of the stamp component as compared to ordinary quartz substrates. In other words, the stamp component can be more uniformly pressed onto every microstructure on the donor substrate side and the receiving substrate side when transferring a large number of microstructures at once. More specifically, the timing when the silicone-based rubber film or the surface of the protrusion formed on the silicone-based rubber film surface contacts the microstructures becomes more uniform, so that their pressing depth becomes more uniform. Thus, the use of the stamp component including the synthetic quartz substrate ensures more constant temporary adhesive strength for all of the large number of microstructures, providing a stable microstructure transfer. It will be appreciated that this effect can also be achieved from transferring a single microstructure with the silicone-based rubber film or the protrusion formed on the silicone-based rubber film surface.

A further benefit of using the synthetic quartz glass is to provide thermal stability. In other words, a synthetic quartz glass substrate has a coefficient of thermal expansion of approximately ⅕ that of other quartz glass substrates, which can reduce thermal distortion during operation. In particular, in the case of the stamp component with a protruding elevation, the use of the synthetic quartz glass can reduce displacement or distortion of the elevation position due to thermal expansion/contraction, ensuring its effectiveness for repeated transfer operations.

Further, a sapphire substrate, which has greater mechanical strength than quartz (including synthetic quartz) substrates, can be used instead of quartz substrates to provide a microstructure-transfer stamp component with excellent durability. In-plane uniformity of a sapphire substrate surface is 15 microns or less in terms of TTV, which is sufficient for the sapphire substrate to be used in substitution for quartz substrates.

Further, a silicon wafer or a silicon wafer piece can be used instead of quartz substrates to provide a microstructure-transfer stamp component with more excellent flatness than that provided by synthetic quartz substrates.

A glass substrate may be used instead of quartz substrates if the size of the microstructure to be transferred is more than about several 100 μm and the flatness is acceptable.

For example, compositions comprising PDMS (polydimethylsiloxane), silicone compositions obtained by modifying the side chains and terminals of PDMS, and combinations thereof may be used for the silicone-based rubber film. Adjusting the respective material compositions (molecular weight, modified groups, modified substances, modified amount, etc.) and, in the case of mixtures, mixing ratios etc. can control the physical properties such as material hardness, pressure adhesive strength, and repeated adhesion capability. In addition to mixing, some optimizations are possible by cross-linking of various modified silicone compositions or three-dimensional structuring of molecules.

Examples of objects to be transferred with the inventive microstructure-transfer stamp component include semiconductor chips and various electrical devices (resistors, coils, capacitors, etc.) and electronic devices (diodes, transistors, thyristors, various advanced LSI/IC chips, 3D mounted chips, SAW filter devices, MEMS chips such as acceleration sensors, as well as LEDs, especially mini LEDs and micro LEDs). The present invention is applicable to mounting these components and assembling electrical and electronic equipment etc.

It should be noted that the present invention is not limited to the above-described embodiments. The embodiments are just examples, and any examples that substantially have the same feature and demonstrate the same functions and effects as those in the technical concept disclosed in claims of the present invention are included in the technical scope of the present invention.

The invention claimed is:

1. A microstructure-transfer stamp component comprising a substrate and a silicone-based rubber film formed on the substrate, wherein one or more protrusions are formed on a surface of the silicone-based rubber film facing away from the substrate, and a surface of a protrusion of the one or more protrusions has one or more recesses, each of the recesses being closed except for a single surface opening, the single surface opening being on a side opposite of the substrate, and the one or more closed recesses are configured to define a closed space together with a microstructure in a state in which the microstructure is adhered to the surface of the silicone-based rubber film including the one or more closed recesses.

2. The microstructure-transfer stamp component according to claim 1, wherein the protrusion comprises two or more tiers of protruding elevations, and an uppermost surface of the two or more tiers of protruding elevations has the one or more closed recesses.

3. The microstructure-transfer stamp component according to claim 1, wherein the one or more closed recesses has a bottom with curvature.

4. The microstructure-transfer stamp component according to claim 3, wherein the bottom of the one or more closed recesses is spherical or aspherical.

5. The microstructure-transfer stamp component according to claim 1, wherein a shape of the surface opening of the one or more closed recesses is a circle or an ellipse.

6. The microstructure-transfer stamp component according to claim 1, wherein a shape of the surface opening of the one or more of the closed recesses is a polygon, and a vertex of the polygon is arc-shaped.

7. The microstructure-transfer stamp component according to claim 1, wherein a plurality of the protrusions are formed on the surface of the silicone-based rubber film, and the plurality of the protrusions are arranged in a matrix in an X direction and a Y direction respectively at predetermined pitches.

8. The microstructure-transfer stamp component according to claim 1, wherein the protrusion has a multi-tiered shape formed of circular pillars, polygonal pillars, frustums, or a combination thereof.

9. The microstructure-transfer stamp component according to claim 1, wherein a cross-sectional shape of the protrusion in a height direction defines an inwardly protruding shape of the protrusion.

10. The microstructure-transfer stamp component according to claim 1, wherein a cross-sectional shape of the protrusion in a height direction defines an outwardly protruding shape of the protrusion.

11. The microstructure-transfer stamp component according to claim 1, wherein a conductive film is formed between the substrate and the silicone-based rubber film.

12. The microstructure-transfer stamp component according to claim 1, wherein the silicone-based rubber film is a conductive film.

13. The microstructure-transfer stamp component according to claim 1, wherein the substrate is a quartz substrate.

14. The microstructure-transfer stamp component according to claim 13, wherein the quartz substrate is a synthetic quartz substrate.

15. The microstructure-transfer stamp component according to claim 1, wherein the substrate is a sapphire substrate.

16. The microstructure-transfer stamp component according to claim 1, wherein the substrate is a silicon wafer or a silicon wafer piece.

17. A microstructure-transfer stamp component comprising a substrate and a rubber film formed on the substrate, wherein one or more protrusions are formed on a surface of the rubber film facing away from the substrate, and a surface of a protrusion of the one or more protrusions has a plurality of recesses, each of the recesses being closed except for a single surface opening, the single surface opening being on a side opposite of the substrate, and the plurality of the closed recesses are configured to define a closed space together with a microstructure in a state in which the microstructure is adhered to the surface of the rubber film including the plurality of the closed recesses.

18. A transfer method, comprising transferring a microstructure with the microstructure-transfer stamp component according to claim 17 by virtue of temporary adhesion between the microstructure-transfer stamp component and the microstructure.

19. A method for manufacturing an electric equipment, comprising transferring an electric device with the microstructure-transfer stamp component according to claim 17 by virtue of temporary adhesion between the microstructure-transfer stamp component and the electric device.

20. A method for manufacturing an electronic equipment, comprising transferring an electronic device with the microstructure-transfer stamp component according to claim 17 by virtue of adhesion between the microstructure-transfer stamp component and the electronic device.

21. A method for manufacturing an LED display, comprising transferring an LED with the microstructure-transfer stamp component according to claim 17 by virtue of adhesion between the microstructure-transfer stamp component and the LED.

* * * * *